(12) United States Patent
Rebhan et al.

(10) Patent No.: US 6,727,731 B1
(45) Date of Patent: Apr. 27, 2004

(54) ENERGY CONTROL FOR AN EXCIMER OR MOLECULAR FLUORINE LASER

(75) Inventors: Ulrich Rebhan, Goettingen (DE); Guenter Nowinski, Unterwellenborn (DE)

(73) Assignee: Lambda Physik AG, Goettingen (DE)

( * ) Notice: Subject to any disclaimer, the term of this patent is extended or adjusted under 35 U.S.C. 154(b) by 102 days.

(21) Appl. No.: 09/688,561

(22) Filed: Oct. 16, 2000

Related U.S. Application Data

(63) Continuation-in-part of application No. 09/484,818, filed on Jan. 18, 2000, now Pat. No. 6,243,405, and a continuation-in-part of application No. 09/447,882, filed on Nov. 23, 1999, and a continuation-in-part of application No. 09/418,052, filed on Oct. 14, 1999, now Pat. No. 6,243,406.

(60) Provisional application No. 60/171,717, filed on Dec. 22, 1999, provisional application No. 60/159,525, filed on Oct. 15, 1999, provisional application No. 60/127,062, filed on Mar. 31, 1999, provisional application No. 60/124,785, filed on Mar. 17, 1999, and provisional application No. 60/123,928, filed on Mar. 12, 1999.

(51) Int. Cl.⁷ .................................... H01S 3/13

(52) U.S. Cl. ............... 327/29.021; 372/25; 372/29.015; 372/30; 372/38.07; 372/38.02

(58) Field of Search ................ 372/30, 25, 29.021, 372/29.012, 29.015, 38.07, 38.04, 38.02, 29.014

(56) References Cited

U.S. PATENT DOCUMENTS

| | | | |
|---|---|---|---|
| 3,806,829 A | 4/1974 | Duston et al. | 331/94.5 |
| 3,899,750 A | 8/1975 | Hochuli | 331/95.5 G |
| 4,009,933 A | 3/1977 | Firester | 350/152 |

(List continued on next page.)

FOREIGN PATENT DOCUMENTS

| | | | |
|---|---|---|---|
| DE | 32 12928 A1 | 10/1983 | H01S/3/02 |
| EP | 0 459 503 A3 | 12/1991 | H01S/3/08 |
| EP | 0 459 503 A2 | 12/1991 | H01S/3/08 |

(List continued on next page.)

OTHER PUBLICATIONS

V. F. Weisskopf, et al., *Z. Physik*, 63, 54, 1930.

J. H. Eberly, "Superradiance Revisited," *American Journal of Physics*, vol. 40/10, Oct. 1972.

(List continued on next page.)

*Primary Examiner*—Jerome Jackson
*Assistant Examiner*—Matthew C. Landau
(74) *Attorney, Agent, or Firm*—Stallman & Pollock LLP

(57) ABSTRACT

A method and gas replenishment algorithm for excimer and molecular fluorine lasers is based on parameters upon which gas aging more closely depends than pulse count, such as input energy to the electrical discharge, and also preferably time. A burst control method and algorithm includes measuring the energies of initial pulses of a first burst occurring after a long burst break, calculating values of input voltages for the initial pulses that would bring output energies of the individual laser pulses or groups of pulses to substantially the same values, and applying the calculated voltages in a subsequent first burst after a long burst break to achieve substantially same predetermined output energy values for the pulses or groups of pulses. Similar operations may be performed for one or more subsequent bursts following the first burst. The values for the first burst may be maintained in a first table of input voltage values to be read by a processor which signals a power supply circuit to apply the voltages according to the voltage values in the table. The values for subsequent bursts may be maintained in a second table, and a third table, etc. A final table such as the third table may be used for all subsequent bursts until another long burst break again occurs, after which the first table is again used for the first burst following the long burst break.

12 Claims, 9 Drawing Sheets

U.S. PATENT DOCUMENTS

| | | | |
|---|---|---|---|
| 4,240,044 A | 12/1980 | Fahlen et al. | 331/94.5 PE |
| 4,380,079 A | 4/1983 | Cohn et al. | 372/87 |
| 4,393,505 A | 7/1983 | Fahlen | 372/57 |
| 4,399,540 A | 8/1983 | Buecher | 372/20 |
| 4,429,392 A | 1/1984 | Yoshida et al. | 372/9 |
| 4,534,034 A | 8/1985 | Hohla et al. | 372/59 |
| 4,611,270 A | 9/1986 | Klauminzer et al. | 364/183 |
| 4,616,908 A | 10/1986 | King | 350/576 |
| 4,674,099 A | 6/1987 | Turner | 372/59 |
| 4,686,682 A | 8/1987 | Haruta et al. | 372/87 |
| 4,691,322 A | 9/1987 | Nozue et al. | 372/82 |
| 4,716,569 A | 12/1987 | Bees | 372/38 |
| 4,719,637 A | 1/1988 | Cavaioli et al. | 372/59 |
| 4,722,090 A | 1/1988 | Haruta et al. | 372/57 |
| 4,740,982 A | 4/1988 | Hakuta et al. | 372/59 |
| 4,756,336 A | 7/1988 | Amezcua | 372/81 |
| 4,763,336 A | 8/1988 | Stephens | 372/81 |
| 4,829,536 A | 5/1989 | Kajiyama et al. | 372/57 |
| 4,856,007 A | 8/1989 | Weiss | 372/29 |
| 4,856,018 A | 8/1989 | Nozue et al. | 372/98 |
| 4,860,300 A | 8/1989 | Baeumler et al. | 372/57 |
| 4,891,818 A | 1/1990 | Levatter | 372/57 |
| 4,905,243 A | 2/1990 | Lokai et al. | 372/32 |
| 4,926,428 A | 5/1990 | Kajiyama et al. | 372/20 |
| 4,953,174 A | 8/1990 | Eldridge et al. | 372/87 |
| 4,964,137 A | 10/1990 | Aramaki et al. | 372/59 |
| 4,975,919 A | 12/1990 | Amada et al. | 372/33 |
| 4,977,573 A | 12/1990 | Bittenson et al. | 372/81 |
| 5,001,721 A | 3/1991 | Ludewig et al. | 372/59 |
| 5,005,181 A | 4/1991 | Yoshioka et al. | 372/59 |
| 5,025,445 A | 6/1991 | Anderson et al. | 372/20 |
| 5,081,635 A | 1/1992 | Wakabayashi et al. | 372/57 |
| 5,090,020 A | 2/1992 | Bedwell | 372/59 |
| 5,095,492 A | 3/1992 | Sandstrom | 372/102 |
| 5,097,291 A | 3/1992 | Suzuki | 355/69 |
| 5,099,491 A | 3/1992 | Chaffee | 372/59 |
| 5,111,473 A | 5/1992 | Rebhan et al. | 372/59 |
| 5,136,605 A | 8/1992 | Basting et al. | 372/59 |
| 5,140,600 A | 8/1992 | Rebhan | 372/25 |
| 5,142,543 A | 8/1992 | Wakabayashi et al. | 372/32 |
| 5,149,659 A | 9/1992 | Hakuta et al. | 436/55 |
| 5,150,370 A | 9/1992 | Furuya et al. | 372/106 |
| 5,221,823 A | 6/1993 | Usui | 219/121.78 |
| 5,226,050 A | 7/1993 | Burghardt | 372/20 |
| 5,243,614 A | 9/1993 | Wakata et al. | 372/29 |
| 5,247,531 A | 9/1993 | Mueller-Horsche | 372/38 |
| 5,247,534 A | 9/1993 | Mueller-Horsche | 372/58 |
| 5,247,535 A | 9/1993 | Mueller-Horsche et al. | 372/86 |
| 5,260,961 A | 11/1993 | Zhou et al. | 372/57 |
| 5,307,364 A | 4/1994 | Turner | 372/60 |
| 5,315,610 A | 5/1994 | Alger et al. | 372/55 |
| 5,337,215 A | 8/1994 | Sunderland et al. | 372/57 |
| 5,337,330 A | 8/1994 | Larson | 372/86 |
| 5,396,514 A | 3/1995 | Voss | 372/57 |
| 5,404,366 A | 4/1995 | Wakabayashi et al. | 372/29 |
| 5,405,207 A | 4/1995 | Zubli | 401/110 |
| 5,430,752 A | 7/1995 | Basting et al. | 372/59 |
| 5,440,578 A | 8/1995 | Sandstrom | 372/59 |
| 5,450,436 A | 9/1995 | Mizoguchi et al. | 372/59 |
| 5,463,650 A | 10/1995 | Ito et al. | 372/57 |
| 5,534,034 A | 7/1996 | Caspers | 623/32 |
| 5,535,233 A | 7/1996 | Mozoguchi et al. | 372/87 |
| 5,557,629 A | 9/1996 | Mozoguchi et al. | 372/87 |
| 5,559,584 A | 9/1996 | Miyaji et al. | 355/73 |
| 5,559,816 A | 9/1996 | Basting et al. | 372/27 |
| 5,586,134 A | 12/1996 | Das et al. | 372/38 |
| 5,590,146 A | 12/1996 | von Borstel | 372/58 |
| 5,596,596 A | 1/1997 | Wakabayashi et al. | 372/102 |
| 5,598,300 A | 1/1997 | Magnusson et al. | 359/566 |
| 5,642,374 A | 6/1997 | Wakabayashi et al. | 372/57 |
| 5,646,954 A | 7/1997 | Das et al. | 372/55 |
| 5,652,681 A | 7/1997 | Chen et al. | 359/831 |
| 5,659,419 A | 8/1997 | Lokai et al. | 359/330 |
| 5,659,531 A | 8/1997 | Ono et al. | 369/109 |
| 5,663,973 A | 9/1997 | Stamm et al. | 372/20 |
| 5,684,822 A | 11/1997 | Partlo | 372/95 |
| 5,710,787 A | 1/1998 | Amada et al. | 372/25 |
| 5,729,562 A | 3/1998 | Birx et al. | 372/38 |
| 5,729,565 A | 3/1998 | Meller et al. | 372/87 |
| 5,748,346 A | 5/1998 | David et al. | 359/15 |
| 5,754,579 A | 5/1998 | Mizoguchi et al. | 372/58 |
| 5,761,236 A | 6/1998 | Kleinschmidt et al. | 372/100 |
| 5,763,855 A | 6/1998 | Shioji | 219/121.84 |
| 5,771,258 A | 6/1998 | Morton et al. | 372/57 |
| 5,802,094 A | 9/1998 | Wakabayashi et al. | 372/57 |
| 5,802,095 A | 9/1998 | Schall | 372/89 |
| 5,811,753 A | 9/1998 | Weick et al. | 219/121.78 |
| 5,818,865 A | 10/1998 | Watson et al. | 372/86 |
| 5,835,520 A | 11/1998 | Das et al. | 372/57 |
| 5,852,627 A | 12/1998 | Ershov | 372/108 |
| 5,856,991 A | 1/1999 | Ershov | 372/57 |
| 5,887,014 A | 3/1999 | Das | 372/59 |
| 5,898,725 A | 4/1999 | Fomenkov et al. | 372/102 |
| 5,901,163 A | 5/1999 | Ershov | 372/20 |
| 5,914,974 A | 6/1999 | Partlo et al. | 372/38 |
| 5,917,849 A | 6/1999 | Ershov | 372/102 |
| 5,923,693 A | 7/1999 | Ohmi et al. | 372/57 |
| 5,936,988 A | 8/1999 | Partlo et al. | 372/38 |
| 5,940,421 A | 8/1999 | Partlo et al. | 372/38 |
| 5,946,337 A | 8/1999 | Govorkov et al. | 372/92 |
| 5,949,806 A | 9/1999 | Ness et al. | 372/38 |
| 5,970,082 A | 10/1999 | Ershov | 372/102 |
| 5,978,391 A | 11/1999 | Das et al. | 372/20 |
| 5,978,394 A | 11/1999 | Newman et al. | 372/32 |
| 5,978,405 A | 11/1999 | Juhasz et al. | 372/57 |
| 5,978,406 A | 11/1999 | Rokni et al. | 372/58 |
| 5,978,409 A | 11/1999 | Das et al. | 372/100 |
| 5,982,795 A | 11/1999 | Rothweil et al. | 372/38 |
| 5,982,800 A | 11/1999 | Ishihara et al. | 372/57 |
| 5,991,324 A | 11/1999 | Knowles et al. | 372/57 |
| 5,999,318 A | 12/1999 | Morton et al. | 359/572 |
| 6,005,879 A * | 12/1999 | Sandstrom et al. | 372/25 |
| 6,005,880 A | 12/1999 | Basting et al. | 372/38 |
| 6,008,497 A * | 12/1999 | Mizoguchi et al. | 250/492.1 |
| 6,014,398 A | 1/2000 | Hofmann et al. | 372/60 |
| 6,018,537 A | 1/2000 | Hofmann et al. | 372/25 |
| 6,020,723 A | 2/2000 | Desor et al. | 320/166 |
| 6,028,872 A | 2/2000 | Partlo et al. | 372/38 |
| 6,028,880 A | 2/2000 | Carlesi et al. | 372/58 |
| 6,061,382 A | 5/2000 | Govorkov et al. | 372/101 |
| 6,067,306 A | 5/2000 | Sandstrom et al. | 372/38 |
| 6,081,542 A | 6/2000 | Scaggs | 372/70 |
| 6,084,897 A | 7/2000 | Wakabayashi et al. | 372/38 |
| 6,141,081 A | 10/2000 | Das et al. | 355/53 |
| 6,151,346 A | 11/2000 | Partlo et al. | 372/38 |
| 6,151,349 A | 11/2000 | Gong et al. | 372/58 |
| 6,154,470 A | 11/2000 | Basting et al. | 372/19 |
| 6,157,662 A | 12/2000 | Scaggs et al. | 372/60 |
| 6,160,831 A | 12/2000 | Kleinschmidt et al. | 372/57 |
| 6,160,832 A | 12/2000 | Kleinschmidt et al. | 372/57 |
| 6,188,710 B1 | 2/2001 | Besaucele et al. | 372/60 |
| 6,212,214 B1 | 4/2001 | Vogler et al. | 372/59 |
| 6,418,155 B1 * | 7/2002 | Wakabayashi et al. | 372/29.021 |

FOREIGN PATENT DOCUMENTS

| | | | | |
|---|---|---|---|---|
| EP | 0 532 751 A1 | 3/1993 | | H01S/3/038 |
| EP | 0 532 751 B1 | 3/1993 | | H01S/3/038 |
| EP | 1 075 060 A2 | 2/2001 | | H01S/3/225 |
| EP | 1 091 462 A2 | 4/2001 | | H01S/3/225 |
| JP | 63-86593 A | 4/1988 | | H01S/3/134 |
| JP | Hei 1-115182 | 5/1989 | | H01S/3/134 |

| | | | |
|---|---|---|---|
| JP | Hei 3-166784 | 7/1991 | ........... H01S/3/134 |
| JP | Hei 3-2658180 | 11/1991 | ........... H01S/3/097 |
| JP | Hei 4-17380 | 1/1992 | ........... H01S/3/097 |
| JP | 10-341050 | 12/1998 | ............. H01S/3/03 |
| WO | WO 99/19952 | 4/1999 | ............. H01S/3/22 |

OTHER PUBLICATIONS

T.Y. Chang, "Improved Uniform–Filed Electrode Profiles for TEA Laser and High–Voltage Applications," *The Review of Scientific Instruments,* Apr. 1973, vol. 44, No. 4, pp. 405–407.

Tennant et al., "Excimer Laser Chemical Problems," *Los Almos National Laboratory Report,* 1982., pp. 1–81.

E.A. Stappaerts, "A Novel Analytical Design Method for Discharge Laser Electrode Profiles," *Applied Physics Letters,* Jun. 15, 1982, vol. 40, No. 12, pp. 1018–1019.

G.J. Ernst, "Compact Uniform Field Electrode Profiles," *Optics Communications,* Aug. 1, 1983, vol. 47, No. 1, pp. 47–51.

G.J. Ernst, "Uniform–Field Electrodes with Minimum Width," *Optics Communications,* vol. 49., No. 4., Mar. 15, 1984, pp. 275–277.

Marchetti et al., "A New Type of Corona–Discharge Photoionization Source for Gas Lasers," *Journal of Applied Physics,* Dec. 1, 1984; vol. 56., No. 11., pp. 3163–3168.

Taylor, R.S., "Preionization and Discharge Stability Study of Long Optical Pulse Duration UV–Preionized XeCl Lasers", *Applied Physics B,* 1986, vol. 41., pp. 1–24.

Ogura, S. et al., "Output Power Stabilization of a XeCl Excimer Laser," *Proceedings of SPIE: Gas and Metal Vapor Lasers and Applications,* Jan. 20–22, 1991., vol. 1412., pp. 123–128.

Golobic et al., Clinical Experience with an Excimer Laser Angioplasty System, *Proceedings of Diagnostic and Therapeutic Cardiovascular Interventions SPIE,* Jan. 20–22, 1991, vol. 1425., pp. 84–91.

Ujda, Z. et al., "Analysis of Possibility of Computer Control of the Parameters of an Excimer Laser Part II Results of Computerization of the Parameter of a XeCl Laser," *Journal of Technical Physics,* 1191, pp. 399–408.

Elliott et al., "Recent Advances in an Excimer Laser Source for Microlithography," *J. Vac. Sci. Technol.,* Nov./Dec. 1991., vol. 9., No. 6., pp. 3122–3125.

Basting et al., "Industrial Excimer Lasers Fundamentals," Technology and Maintenance, 1991, pp. 1–97.

Patent Abstracts of Japan, Jul. 30, 1990 Publication No. JP 04 087388A, application No. 02202776.

G. M. Jursich, et al., "Gas Contaminant Effects in Discharge–excited KrF Lasers," *Applied Optics,* vol. 31, Apr. 1992.

Press Release: Lambda Physik Highlight, Apr. 1993.

Turner et al., "Dependence of Excimer Laser Beam Properties on Laser Gas Composition," *SPIE,* 1993, vol. 1835., pp. 158–164.

Taylor et al., "Pre–preionization of a Long Optical Pulse Magnetic–Spiker Sustainer XeCl Laser," *Review of Scientific Instruments,* 1994, vol. 65., No. 12., pp. 3621–3627.

Borisov et al., "Effects Limiting the Average Power of Compact Pulse–Periodic KrF Lasers," *Quantum Mechanics,* vol. 25., No. 5., pp. 421–425, 1995.

Pätzel, et al., "KrF Excimer Laser with Repetition Rates of 1 kHz for DUV Lithography," *SPIE,* vol. 2440, 101, 1995.

R.S. Taylor., "Transmission Properties of Spark Preionization Radiation in Rare–Gas Halide Laser Gas Mixes," *IEEE Journal of Quantum Mechanics of Quantum Mechanics,* Dec. 1995, vol. 31., No. 12., pp. 2195–2207.

Kataoka et al., "Performance Improvement of a Discharge–pumped Arf Excimer Laser by Xenon Gas Addition," *Japanese Journal of Applied Physics, Part 1,* Dec. 1999., vol. 38., No. 12A., pp. 6735–6738.

Wakabayashi et al., "Billion Level Durable ArF Excimer Laser with Highly Stable Energy," *SPIE 24th Annual International Symposium on Microlithography,* May 14–19, 1999.

Enami et al., "High Spectral Purity and High Durability kHz KrF Excimer Laser with Advanced RF Preionization Discharge," *Proceedings of SPIE Optical Microlithography XI,* Feb. 1998, vol. 3334, pp. 1031–1040.

* cited by examiner

Valves for gas control system including micro-halogen injections

H: halogen gas
R: rare gas
B: buffer gas
I: inert gas
LH: laser head
V: vacuum

ENERGY CONTROL FOR AN EXCIMER OR MOLECULAR FLUORINE LASER

PRIORITY

This application claims the benefit of priority to U.S. provisional patent application No. 60/159,525, filed Oct. 15, 1999, and No. 60/171,717, filed Dec. 22, 1999, and this application is a continuation-in-part of U.S. patent application Ser. No. 09/447,882, filed Nov. 23, 1999, which claims the benefit of U.S. provisional application No. 60/124,785, filed Mar. 17, 1999, and this application is a continuation-in-part of U.S. patent application Ser. No. 09/418,052, filed Oct. 14, 1999 now U.S. Pat. No. 6,243,406, which claims the benefit of U.S. provisional application No. 60/123,928, filed Mar. 12, 1999, and this application is a continuation-in-part of U.S. patent application Ser. No. 09/484,818, filed Jan. 18, 2000 now U.S. Pat. No. 6,243,405, which claims the benefit of U.S. provisional patent application No. 60/127,062, filed Mar. 31, 1999, all of the above application being hereby incorporated by reference.

BACKGROUND OF THE INVENTION

1. Field of the Invention

The invention relates to energy control for excimer and molecular fluorine gas lasers, and particularly to control and feedback software algorithms and gas replenishment for maintaining constant laser output emission pulse energies and/or application process energy doses.

2. Discussion of the Related Art

The energy of output emission pulses of an excimer or molecular fluorine laser will decrease continuously unless certain input parameters or conditions are controlled during the operation of the laser. This is due to halogen consumption by reactions of the halogen gas within the gas vessel and halogen burn up by the gas discharge. Additionally, the output power will decrease due to build up of gas contamination.

An excimer laser can be operated for a certain time at a constant energy level if the charging voltage is continuously increased to compensate these factors which cause energy losses. For demanding applications like lithography or TFT annealing, it is desired to maintain control of the charging voltage, as well as other beam parameters, in addition to pulse energy or laser output power. Therefore, more sophisticated processes were developed. When a maximum applicable charging voltage is reached, gas replenishment actions can be performed to further extend the operation time at constant energy of the laser. Such gas replenishment actions may be performed to compensate halogen depletion and for contamination reduction. Halogen depletion is typically compensated by halogen injections (HI). Contamination reduction is achieved by partial gas replacements (PGR).

Gas replenishment was introduced around 1986 for excimer lasers (see U.S. Pat. No. 4,997,573, which is hereby incorporated by reference). Gas replenishment actions may be triggered when the charging voltage exceeds a preset level. Gas replenishment actions have been characterized in the past by significant reductions in charging voltage. Large variations in charging voltage during long constant energy operation periods are a disadvantage, however, because such large variations in charging voltage can affect various beam parameters other than beam energy or power. In other words, large variations in charging voltage for stabilizing the output energy serve to destabilize other important beam parameters.

In order to maintain both the charging voltage and the output energy or power of the laser at substantially constant levels, large gas replenishment actions were replaced by smaller gas actions such as micro halogen injections (HI) and micro partial gas replacements or mini gas replacements (GR or mGR) (see U.S. patent application Ser. No. 09/447,882 and No. 60/171,717, each of which is assigned to the same assignee and is hereby incorporated by reference). These micro or mini gas replenishment actions preferably result in little or no disturbance in charging voltage that is detectable with sufficient precision under industrial operation conditions. Therefore, it is desired to use another parameter other than changes in the charging voltage to trigger the micro or mini gas replenishment actions. One parameter that may be used is the number of laser pulses, or pulse count, as a suitable trigger for micro or mini gas replenishment actions. This was disclosed in U.S. Pat. No. 5,097,291 and later in U.S. Pat. No. 5,337,215, each of which is hereby incorporated by reference. For example, a gas replenishment action may be performed periodically approximately every 100,000 pulses.

For microlithography scanner systems, it is desired to maintain constant energy dose when scanning over a die site on a wafer. The scanning speed, the exposure slit width and the laser repetition rate determine the number of pulses overlaid at each site on the wafer. The number of overlaid pulses is dependent on the application process. For example, approximately 40 pulses may be overlaid at a die site, whereas a typical length of a burst may be between 100 and 500 pulses.

The constant energy dose for each site on a wafer may be specified by a moving energy average. Precise dose control may then be observed as low fluctuation in moving energy average. The output energy of the laser may be controlled by changing the high voltage (HV) that is used for a discharge in the laser tube. The output energy can be and typically is measured for each pulse, and also the HV can be changed for each individual pulse.

Excimer and molecular fluorine lasers may be typically operated in burst mode. This means that the laser generates a "burst" of pulses, such as 100 to 500 pulses as mentioned above at a constant repetition rate, followed by a burst break or pause of from a few milliseconds up to a few seconds while the stepper/scanner does some wafer positioning. A burst break may be a short burst break such as may occur when the beam spot is moved to a different location on a same wafer, or may be a long burst break such as would occur when the stepper/scanner changes the wafer.

When an excimer or molecular fluorine laser is operated in burst mode, the first few pulses of each burst will have a higher pulse energy than later pulses if left uncompensated. Therefore, the moving average at the beginning of a burst would be higher than later in the burst. It is desired to compensate this overshoot in order to achieve a constant energy dose. Overshoot compensation may be achieved by reducing the charging voltage for the first few pulses (see U.S. Pat. Nos. 5,463,650, 5,710,787 and 6,084,897, each of which is hereby incorporated by reference). This allows the energy dose to be kept constant at the beginning of a burst sequence. The charging voltage is adjusted for each laser pulse at the beginning of a burst below that which is applied to pulses later in the burst.

The problem that the first few pulses after a burst break (at the beginning of a burst) have a higher ratio of energy to HV than the pulses in the middle or at the end of a burst, can be understood by observing what happens when the HV is kept constant during the burst, as illustrated in the sketch of FIG. 1. In the sketch of FIG. 1, the first 5 to 10 pulses have a high energy, and then the energy first decays rapidly, and then more slowly until after 20 to 100 pulses the energy reaches a constant level. This phenomenon is called overshoot or spiking.

In order to keep the pulse energy or energy dose constant (which is desired during laser operation), one uses a low HV for the first pulses of a burst and then increases the HV to a constant level during the burst. This is done in response to the overshoot of the pulse energy that will otherwise occur as just described.

The exact behavior of the energy is affected by various parameters in a way that is difficult to predict. It is desired to have a technique for predicting the HV for the next pulse so that the energy of the next pulse or the energy dose at the application process will meet the target energy or target energy dose.

RECOGNIZED IN THE INVENTION

There are short-term effects and long-term effects that influence the behavior associated with the energies of pulses during burst and from burst to burst. Short-term effects may last for only a few seconds or less. Long term effects include gas aging (several days), tube aging (several months) and maybe optical effects (years). These effects may be taken into account by changing controller parameters. The parameter adaptation may be advantageously performed automatically.

The energy behavior changes, depending on the length of the burst break, the repetition rate of the laser, the energies of the most recent pulses and other effects. It is more difficult to control the energies of the first pulses in a burst than it is to keep the energy or energy-dose constant for pulses at the middle and end of a burst because gas conditions do not change as rapidly with time over the duration of the burst. It is thus desired to have pulse energy or energy dose control algorithm that produces high pulse energy or energy dose stability at the beginning of a burst, and also throughout the entirety of the burst.

Gas aging depends on time and input energy into the electrical discharge. A typical time constant for gas replenishment actions based on time may be several hours, e.g., eight hours. Depending on the laser wavelength and the particular laser construction and operation mode and other parameters, the time constant can be as low as 1 hour or less, and it can be more than a day.

State of the art gas replenishment is based on pulse count (see, e.g., the '241 and '215 patents, mentioned above). A gas replenishment algorithm based on pulse count would work very well in the case of constant energy input into the laser discharge for each laser pulse or group of pulses. It is recognized in the invention that the input energy into the laser discharge is not, however, constant for each laser pulse or group of pulses over periods of laser operation. Particularly in industrial lithography processes, the input energy into the discharge is not constant for each laser pulse or group of pulses, particularly over many thousands of pulses. It is desired then to have a gas replenishment algorithm for performing gas replenishment actions based on those parameters such as time and input energy to the electrical discharge, upon which gas aging more closely depends, rather than pulse count.

SUMMARY OF THE INVENTION

It is therefore an object of the present invention to provide a gas replenishment algorithm that is based on parameters upon which gas aging more closely depends than pulse count, such as input energy to the electrical discharge, and also preferably time.

It is a further object of the invention to provide a pulse energy or energy dose control algorithm that produces high pulse energy stability or energy dose stability for initial pulses of a burst, and also preferably throughout the entirety of the burst.

In a first aspect of the invention according to the above objects, a gas discharge laser system is provided which includes a discharge chamber having multiple electrodes therein and containing a gas mixture including one or more components which are subject to depletion, a power supply circuit coupled to the electrodes for energizing the gas mixture, and a resonator for generating a laser beam. A processor monitors the accumulated energy applied to the discharge of the laser as a measure of gas mixture status, and a gas control unit serves to replenish the gas mixture based on the monitored accumulated energy applied to the discharge. The processor preferably also monitors the time as an additional measure of gas mixture status, and the gas control unit replenishes the gas mixture based on the monitored time in addition to the accumulated energy applied to the discharge. Charging voltage and variations of charging voltage may also be monitored along with the accumulated energy applied to the discharge and/or the time, and the gas control unit replenishes the gas mixture based on the monitored charging voltage and/or variations in the charging voltage in addition to the accumulated energy to the discharge and/or the time.

A method of stabilizing during operation a gas mixture initially provided within a discharge chamber of a gas discharge laser with an initial composition including one or more component gases that are subject to depletion is also provided. The method includes the steps of monitoring accumulated energy applied to the discharge of the laser, and determining the status of and/or adjusting the gas mixture based on the monitored accumulated energy applied to the discharge. Time is also preferably monitored along with the accumulated energy applied to the discharge. Charging voltage and variations of charging voltage may also be monitored along with the accumulated energy applied to the discharge and/or the time.

Therefore, in accord with a first aspect of the invention, it is of advantage to trigger gas replenishment actions on accumulated energy applied to the discharge. The new method is more flexible and therefore more powerful than, e.g., triggering gas replenishment actions on pulse count. If the pulse energy is varied then the new algorithm advantageously extends or shortens the gas replenishment interval correspondingly, thereby improving the laser performance.

In a second aspect of the invention according to the above objects, a method is provided for controlling output energies of successive pulses from a gas discharge laser operating in burst mode and characterized by emitting bursts of several pulses each followed by one of a long burst break and a short burst break depending on specifications of an application process. The method includes the steps of measuring the energies of at least a predetermined number of initial pulses of a first burst occurring after a long burst break, calculating values of input voltages for each of the initial pulses that would bring corresponding output energies of the initial pulses to a substantially same predetermined value for a subsequent first burst following a similar long burst break, and applying input voltages corresponding to the calculated values in a subsequent first burst after a similar long burst break such that pulses generated thereby have the substantially same predetermined output energy value.

The method may further include measuring the energies of at least a predetermined number of initial pulses of at least one second burst occurring a short burst break after a first burst following a long burst break, calculating values of input voltages for each of the initial pulses of the second burst that would bring corresponding output energies of the initial pulses of the second burst to a substantially same predetermined value for a subsequent second burst following a similar short burst break after a first burst following a similar long burst break, and applying input voltages corresponding to the calculated values for the initial values in the subsequent second burst following said similar short burst break after said first burst after said similar long burst break such that pulses generated thereby have said substantially same predetermined output energy value.

The method may further include measuring the energies of at least a predetermined number of initial pulses of at least one third or later burst occurring at least two short burst breaks after a long burst break, calculating values of input voltages for each of the initial pulses of the third burst that would bring corresponding output energies of the initial pulses of the third burst to a substantially same predetermined value for one or more subsequent bursts which occur after at least two short burst breaks following a long burst break, and applying input voltages corresponding to the calculated values for the one or more subsequent bursts after the two short burst breaks following the long burst break such that pulses generated thereby each have a substantially same predetermined output energy value.

The method may further include repeatedly applying the input voltages corresponding to the calculated values for the subsequent burst after the two short burst breaks following the long burst break to generate thereby additional bursts with initial pulses each having the substantially same predetermined value. The method may also further include measuring output laser energies corresponding to later pulses in a burst in addition to the initial pulses, calculating values of input voltages corresponding to each of these later pulses that would bring output energy doses of the laser, corresponding to sums of pulse energies of consecutive pulses, each to a substantially same predetermined energy dose value, and applying input voltages corresponding to the calculated values for bringing output energy doses to the substantially same predetermined value, such that energy doses associated with groups of pulses generated thereby each have a substantially same predetermined energy dose value.

Further in accord with the second aspect of the invention, an energy control software algorithm is provided for controlling output energies of successive pulses in a burst of pulses from a gas discharge laser operating in burst mode and characterized by emitting bursts of several pulses each followed by one of a long burst break and a short burst break depending on specifications of an application process. The algorithm provides a first table of input voltage values to be read by a processor which signals a power supply circuit to apply voltages according to the voltage values in the first table to thereby generate initial pulses in a subsequent first burst of output laser pulses after a long burst break each having a substantially same energy value. The input voltage values in said first table are calculated from measured data of initial pulses in a previous first burst after a long burst break. The input voltage values are used for producing the initial pulses each at a substantially same energy value.

The algorithm preferably further provides in a similar manner a second table of input voltage values to be read by the processor which signals the power supply circuit to apply voltages according to the voltage values in the second table to thereby generate initial pulses in a subsequent second burst of output laser pulses occurring after a short burst break following a first burst after a long burst break. The algorithm further provides in a similar manner a third table of input voltage values to be read by the processor which signals the power supply circuit to apply voltages according to the voltage values in the third table to thereby generate initial pulses in a subsequent third or later burst occurring after a short burst break following first and second bursts after a long burst break.

The table is created according to the steps of measuring energies of initial pulses of a first burst following a long burst break, calculating values of input voltages for initial pulses based on the measured initial pulse energies that would bring output energies of the laser corresponding to each of the initial pulses to a substantially same predetermined value for a subsequent first burst following a similar long burst break, and storing the calculated values of input voltages for initial pulses as the table, such that pulses generated according to input voltage values stored in the first table have a substantially same predetermined output energy value.

The algorithm preferably further provides that the table is updated according to the further steps of measuring energies of initial pulses of a subsequent first burst following a subsequent long burst break, calculating values of input voltages for initial pulses based on the measured initial pulse energies of the subsequent first burst that would bring output energies of the laser corresponding to each of the initial pulses to a substantially same predetermined value for another subsequent first burst following another subsequent long burst break, and updating the values in the table of input voltages for initial pulses in the first table using the calculated values of input voltages for initial pulses based on the measured initial pulse energies of the subsequent first burst, such that pulses generated according to input voltage values stored in the first table have a substantially same predetermined output energy value.

Preferably, in the second aspect of the invention, the energy dose of groups of pulses after the initial pulses, or of all groups of pulses is kept constant. This means that the sum of n pulse energies, e.g., for n=40 pulse energies, is kept constant for each package of n subsequent pulses. This sum, divided by the number of pulses in it, is referred to as the moving average.

INCORPORATION BY REFERENCE

What follows is a cite list of references each of which is, in addition to those references cited above in the priority section, hereby incorporated by reference into the detailed description of the preferred embodiment below, as disclosing alternative embodiments of elements or features of the preferred embodiments not otherwise set forth in detail below. A single one or a combination of two or more of these references may be consulted to obtain a variation of the preferred embodiments described in the detailed description below. Further patent, patent application and non-patent references are cited in the written description and are also incorporated by reference into the preferred embodiment with the same effect as just described with respect to the following references:

U.S. Pat. Nos. 4,997,573, 5,337,215, 5,097,291, 5,140,600, 5,450,436, 4,674,099, 5,463,650, 5,710,787, 6,084,897;

U.S. patent application Nos. 60/123,928, 60/124,785, 60/137,907, Ser. Nos. 09/379,034, 09/447,882, 09/379,034, 09/484,818, 09/418,052, 09/513,025, No. 60/171,717, each of which is assigned to the same assignee as the present application; and Japanese Published Application No. SHO-63-86593.

Detailed Description of the Preferred Embodiment
Gas Discharge Laser System

Figure 2:
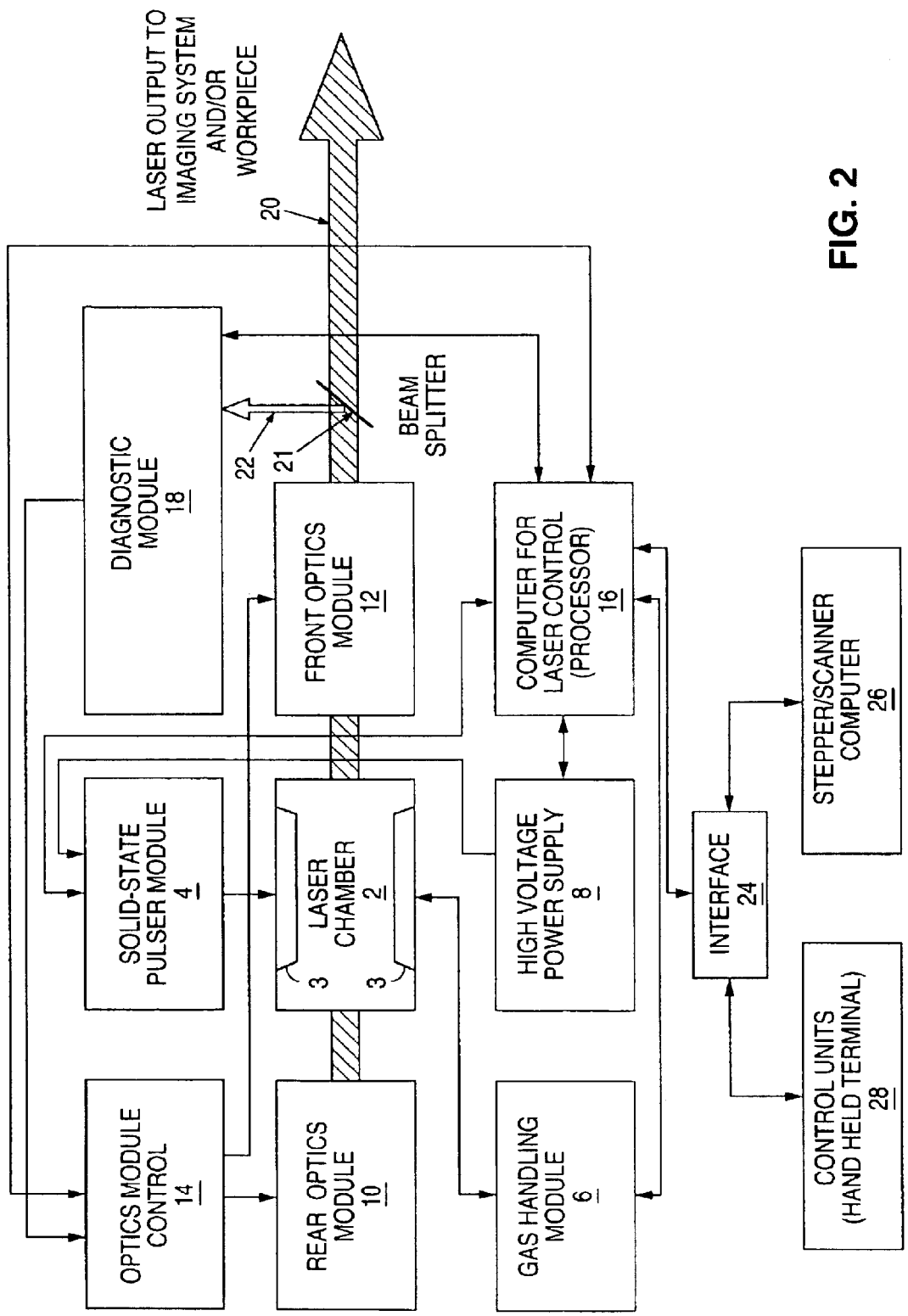
FIG. 2 schematically shows an excimer or molecular fluorine laser system in accord with a preferred embodiment.

Referring to FIG. 2, a gas discharge laser system, preferably a DUV or VUV laser system, such as an excimer, e.g., ArF or KrF, or molecular fluorine ($F_2$) laser system for deep ultraviolet (DUV) or vacuum ultraviolet (VUV) lithography, is schematically shown. Alternative configurations for laser systems for use in such other industrial applications as TFT annealing and/or micromachining, e.g., are understood by one skilled in the art as being similar to and/or modified from the system shown in FIG. 2 to meet the requirements of that application. For this purpose, alternative DUV or VUV laser system and component configurations are described at U.S. patent application Ser. Nos. 09/317,695, 09/317,526, 09/130,277, 09/244,554, 09/452,353, 09/317,527, 09/343,333, Nos. 60/122,145, 60/140,531, 60/162,735, 60/166,952, 60/171,172, 60/141,678, 60/173,993, 60/166,967, 60/147,219, 60/170,342, 60/162,735, 60/178,445, 60/166,277, 60/167,835, 60/171,919, 60/202,564, 60/204,095, 60/172,674, Ser. No. 09/574,921 and No. 60/181,156, and U.S. Pat. Nos. 6,005,880, 6,061,382, 6,020,723, 5,946,337, 6,014,206, 5,559,816, 4,611,270, 5,761,236, each of which is assigned to the same assignee as the present application and is hereby incorporated by reference.

The system shown in FIG. 2 generally includes a laser chamber 2 having a pair of main discharge electrodes 3 connected with a solid-state pulser module 4, and a gas handling module 6. The solid-state pulser module 4 is powered by a high voltage power supply 8. The laser chamber 2 is surrounded by optics module 10 and optics module 12, forming a resonator. The optics modules 10 and 12 are controlled by an optics control module 14, or may be alternatively directly controlled by a computer 16.

The computer 16 for laser control receives various inputs and controls various operating parameters of the system. A diagnostic module 18 receives and measures one or more parameters of a split off portion of the main beam 20 via optics for deflecting a small portion of the beam toward the module 18, such as preferably a beam splitter module 21, as shown. The beam 20 is preferably the laser output to an imaging system (not shown) and ultimately to a workpiece (also not shown), and may be output directly to an application process. The laser control computer 16 communicates through an interface 24 with a stepper/scanner computer 26 and other control units 28.

Laser Chamber

The laser chamber 2 contains a laser gas mixture and includes one or more preionization electrodes (not shown) in addition to the pair of main discharge electrodes 3. Preferred main electrodes 3 are described at U.S. patent application Ser. No. 09/453,670, Nos. 60/184,705 and 60/128,227, each of which is assigned to the same assignee as the present application and is hereby incorporated by reference. Other electrode configurations are set forth at U.S. Pat. Nos. 5,729,565 and 4,860,300, each of which is assigned to the same assignee, and alternative embodiments are set forth at U.S. Pat. Nos. 4,691,322, 5,535,233 and 5,557,629, all of which are hereby incorporated by reference. Preferred preionization units are set forth at U.S. patent application Nos. 60,162,845, 60/160,182, 60/127,237, Ser. Nos. 09/535, 276 and 09/247,887, each of which is assigned to the same assignee as the present application, and alternative embodiments are set forth at U.S. Pat. Nos. 5,337,330, 5,818,865 and 5,991,324, all of the above patents and patent applications being hereby incorporated by reference.

Power Supply Circuit and Pulser Module

The solid-state pulser module 14 and high voltage power supply 8 supply electrical energy in compressed electrical pulses to the preionization and main electrodes 3 within the laser chamber 2 to energize the gas mixture. Components of the preferred pulser module and high voltage power supply may be described at U.S. patent application Nos. 60/149,392, 60/198,058, 60/204,095, Ser. Nos. 09/432,348 and 09/390,146, and No. 60/204,095, and U.S. Pat. Nos. 6,005,880 and 6,020,723, each of which is assigned to the same assignee as the present application and which is hereby incorporated by reference into the present application. Other alternative pulser modules are described at U.S. Pat. Nos. 5,982,800, 5,982,795, 5,940,421, 5,914,974, 5,949,806, 5,936,988, 6,028,872 and 5,729,562, each of which is hereby incorporated by reference. A conventional pulser module may generate electrical pulses in excess of 3 Joules of electrical power (see the '988 patent, mentioned above).

Laser Resonator

The laser resonator which surrounds the laser chamber 2 containing the laser gas mixture includes optics module 10 including line-narrowing optics for a line narrowed excimer or molecular fluorine laser, which may be replaced by a high reflectivity mirror or the like in a laser system wherein either line-narrowing is not desired, or if line narrowing is performed at the front optics module 12, or a spectral filter external to the resonator is used, or if the line-narrowing optics are disposed in front of the HR mirror, for narrowing the linewidth of the output beam. The laser chamber 2 is sealed by windows transparent to the wavelengths of the emitted laser radiation 14. The windows may be Brewster windows or may be aligned at another angle, e.g., 5°, to the optical path of the resonating beam. One of the windows may also serve to output couple the beam.

Extra-Resonator Features

After a portion of the output beam 20 passes the outcoupler of the optics module 12, that output portion impinges upon beam splitter module 21 which includes optics for deflecting a portion of the beam to the diagnostic module 18, or otherwise allowing a small portion of the outcoupled beam to reach the diagnostic module 18, while a main beam portion 20 is allowed to continue as the output beam 20 of the laser system. Preferred optics include a beamsplitter or otherwise partially reflecting surface optic. The optics may also include a mirror or beam splitter as a second reflecting optic. More than one beam splitter and/or HR mirror(s), and/or dichroic mirror(s) may be used to direct portions of the beam to components of the diagnostic module 18. A holographic beam sampler, transmission grating, partially transmissive reflection diffraction grating, grism, prism or other refractive, dispersive and/or transmissive optic or optics may also be used to separate a small beam portion from the main beam 20 for detection at the diagnostic module 18, while allowing most of the main beam 20 to reach an application process directly or via an imaging system or otherwise.

The output beam 20 may be transmitted at the beam splitter module 21 while a reflected beam portion is directed at the diagnostic module 18, or the main beam 20 may be reflected, while a small portion is transmitted to the diagnostic module 18. The portion of the outcoupled beam which continues past the beam splitter module 21 is the output beam 20 of the laser, which propagates toward an industrial or experimental application such as an imaging system and workpiece for photolithographic applications. Variations of beam splitter modules particularly for a molecular fluorine laser system are set forth at U.S. patent application Ser. No. 09/598,552 and No. 60/140,530, which are each assigned to the same assignee and are hereby incorporated by reference.

Beam Path Enclosure

Also particularly for the molecular fluorine laser system, and for the ArF laser system, an enclosure (not shown) may seal the beam path of the beam 20 such as to keep the beam path free of photoabsorbing species. Smaller enclosures may seal the beam path between the chamber 2 and the optics modules 10 and 12 and between the beam splitter 22 and the diagnostic module. The preferred enclosure is described in detail in the Ser. Nos. 09/343,333, 09/598,552, 09/594,892, 09/131,580 and No. 60/140,530 applications, each of which is assigned to the same assignee and is hereby incorporated by reference, and U.S. Pat. Nos. 5,559,584, 5,221,823, 5,763,855, 5,811,753 and 4,616,908, all of which are hereby incorporated by reference.

Diagnostic Module The diagnostic module 18 preferably includes at least one energy detector. This detector measures the total energy of the beam portion that corresponds directly to the energy of the output beam 20 (see U.S. Pat. No. 4,611,270 and U.S. patent application Ser. No. 09/379,034, each of which is assigned to the same assignee and is hereby incorporated by reference. An optical configuration such as an optical attenuator, e.g., a plate or a coating, or other optics may be formed on or near the detector or beam splitter module 21 to control the intensity, spectral distribution and/or other parameters of the radiation impinging upon the detector (see U.S. patent application Ser. No. 09/172,805, Nos. 60/172,749, 60/166,952 and 60/178,620, each of which is assigned to the same assignee as the present application and is hereby incorporated by reference).

One other component of the diagnostic module 18 is preferably a wavelength and/or bandwidth detection component such as a monitor etalon or grating spectrometer (see U.S. patent application Ser. No. 09/416,344, Nos. 60/186,003, 60/158,808, 60/186,096, 60/186,096 and 60/186,096 and 60/202,564, each of which is assigned to the same assignee as the present application, and U.S. Pat. Nos. 4,905,243, 5,978,391, 5,450,207, 4,926,428, 5,748,346, 5,025,445, and 5,978,394, all of the above wavelength and/or bandwidth detection and monitoring components being hereby incorporated by reference.

Other components of the diagnostic module may include a pulse shape detector or ASE detector, such as are described at U.S. patent application Ser. Nos. 09/484,818 and 09/418,052, respectively, each of which is assigned to the same assignee as the present application and is hereby incorporated by reference, such as for gas control and/or output beam energy stabilization, or to monitor the amount of amplified spontaneous emission (ASE) within the beam to ensure that the ASE remains below a predetermined level, as set forth in more detail below. There may be a beam alignment monitor, e.g., such as is described at U.S. Pat. No. 6,014,206 which is assigned to the same assignee and is hereby incorporated by reference.

Control Processor

The processor or control computer 16 receives and processes values of some of the pulse shape, energy, ASE, energy stability, energy overshoot for burst mode operation, wavelength, spectral purity and/or bandwidth, among other input or output parameters of the laser system and output beam. The processor 16 also controls the line narrowing module to tune the wavelength and/or bandwidth or spectral purity, and controls the power supply and pulser module 4 and 8 to control preferably the moving average pulse power or energy, such that the energy dose at points on the workpiece is stabilized around a desired value. In addition, the computer 16 controls the gas handling module 6 which includes gas supply valves connected to various gas sources. Further functions of the processor 16 are described in more detail below.

Gas Mixture

The laser gas mixture is initially filled into the laser chamber 2 during new fills. The gas composition for a very stable excimer or molecular fluorine laser in accord with the preferred embodiment uses molecular or HCL and, in the case of KrF and ArF lasers, krypton and argon (about 1.00% concentration), respectively, and helium or neon or a mixture of helium and neon as buffer gas(es), depending on the particular laser being used. Preferred gas compositions are described at U.S. Pat. Nos. 4,393,405 and 4,977,573 and U.S. patent application Ser. Nos. 09/317,526, 09/513,025, No. 60/124,785, Ser. No. 09/418,052, Nos. 60/159,525 and 60/160,126, each of which is assigned to the same assignee and is hereby incorporated by reference into the present application. The concentration of the fluorine or HCl in the gas mixture may range from 0.003% to 1.00%, and is preferably around 0.1%. An additional gas additive, such as a rare gas, may be added for increased energy stability and/or as an attenuator as described in the Ser. No. 09/513,025 application incorporated by reference above. Specifically, for the F2-laser, an addition of xenon and/or argon may be used. The concentration of xenon or argon in the mixture may range from 0.0001% to 0.1%. For an ArF-laser, an addition of xenon or krypton may be used also having a concentration between 0.0001% to 0.1%. For the KrF laser, an addition of xenon or argon may be used also having a concentration between 0.0001% to 0.1%.

Gas Replenishment, General

Halogen and rare gas injections, total pressure adjustments and gas replacement procedures are performed using the gas handling module 6 preferably including a vacuum pump, a valve network and one or more gas compartments. The gas handling module 6 receives gas via gas lines connected to gas containers, tanks, canisters and/or bottles. Some prefered and alternative gas handling and/or replenishment procedures, other than as specifically described herein (see below), are described at U.S. Pat. Nos. 4,977,573 and 5,396,514 and U.S. patent application No. 60/124,785, Ser. Nos. 09/418,052, 09/379,034, Nos. 60/171,717, and 60/1 59,525, each of which is assigned to the same assignee as the present application, and U.S. Pat. Nos. 5,978,406, 6,014,398 and 6,028,880, all of which are hereby incorporated by reference. A xenon gas supply may be included either internal or external to the laser system according to the '025 application, mentioned above.

Line-Narrowing

A general description of the line-narrowing features of the several embodiments of the present is provided here, followed by a listing of patent and patent applications being incorporated by reference as describing variations and features that may used within the scope of the present invention for providing an output beam with a high spectral purity or bandwidth (e.g., below 1 pm). Exemplary line-narrowing optics contained in the optics module 10 include a beam expander, an optional etalon and a diffraction grating, which produces a relatively high degree of dispersion, for a narrow band laser such as is used with a refractive or catadioptric optical lithography imaging system. As mentioned above, the front optics module may include line-narrowing optics as well (see the Nos. 60/166,277, 60/173,993 and 60/166,967 applications, each being assigned to the same assignee and hereby incorporated by reference).

For a semi-narrow band laser such as is used with an all-reflective imaging system, the grating may be replaced with a highly reflective mirror, and a lower degree of dispersion may be produced by a dispersive prism. A semi-narrow band laser would typically have an output beam linewidth in excess of 1 pm and may be as high as 100 pm in some laser systems, depending on the characteristic broadband bandwidth of the laser.

The beam expander of the above exemplary line-narrowing optics of the optics module 10 preferably includes one or more prisms. The beam expander may include other beam expanding optics such as a lens assembly or a converging/diverging lens pair. The grating or a highly reflective mirror is preferably rotatable so that the wavelengths reflected into the acceptance angle of the resonator can be selected or tuned. Alternatively, the grating, or other optic or optics, or the entire line-narrowing module may be pressure tuned, such as is set forth in the No. 60/178,445 and Ser. No. 09/317,527 applications, each of which is assigned to the same assignee and is hereby incorporated by reference. The grating may be used both for dispersing the beam for achieving narrow bandwidths and also preferably for retroreflecting the beam back toward the laser tube. Alternatively, a highly reflective mirror is positioned after the grating which receives a reflection from the grating and reflects the beam back toward the grating in a Littman configuration, or the grating may be a transmission grating. One or more dispersive prisms may also be used, and more than one etalon may be used.

Depending on the type and extent of line-narrowing and/or selection and tuning that is desired, and the particular laser that the line-narrowing optics are to be installed into, there are many alternative optical configurations that may be used. For this purpose, those shown in U.S. Pat. Nos. 4,399,540, 4,905,243, 5,226,050, 5,559,816, 5,659,419, 5,663,973, 5,761,236, and 5,946,337, and U.S. patent application Ser. Nos. 09/317,695, 09/130,277, 09/244,554, 09/317,527, 09/073,070, Nos. 60/124,241, 60/140,532, 60/147,219 and 60/140,531, 60/147,219, 60/170,342, 60/172,749, 60/178,620, 60/173,993, 60/166,277, 60/166, 967, 60/167,835, 60/170,919, 60/186,096, each of which is assigned to the same assignee as the present application, and U.S. Pat. Nos. 5,095,492, 5,684,822, 5,835,520, 5,852,627, 5,856,991, 5,898,725, 5,901,163, 5,917,849, 5,970,082, 5,404,366, 4,975,919, 5,142,543, 5,596,596, 5,802,094, 4,856,018, 5,970,082, 5,978,409, 5,999,318, 5,150,370 and 4,829,536, and German patent DE 298 22 090.3, are each hereby incorporated by reference into the present application.

Optics module 12 preferably includes means for outcoupling the beam 20, such as a partially reflective resonator reflector. The beam 20 may be otherwise outcoupled such as by an intra-resonator beam splitter or partially reflecting surface of another optical element, and the optics module 12 would in this case include a highly reflective mirror. The optics control module 14 preferably controls the optics modules 10 and 12 such as by receiving and interpreting signals from the processor 16, and initiating realignment or reconfiguration procedures (see the '241, '695, '277, '554, and '527 applications mentioned above).

Gas Replenishment Based at Least in Part on Accumulated Energy Applied to the Discharge of the Laser, General A preferred embodiment with respect to the first aspect of the invention is now described below. This first aspect of the invention discloses a gas replenishment algorithm depending on accumulated input energy into the laser discharge, and preferably also on time. The preferred method is more flexible than an algorithm based on simple pulse counts. For example, if the exposure process requires a lower pulse energy and the charging voltage has to be adjusted accordingly, then a new gas replenishment algorithm will extend the replenishment intervals. In case of higher pulse energy the intervals will be reduced. By this method the replenishment is automatically adjusted to the actual halogen burn-up by the gas discharge.

In this regard, the gas replenishment scheme, which is preferably performed according to the Ser. No. 09/447,882 or No. 60/171,717 applications, mentioned above, may be set such that at certain values of the accumulated energy applied to the discharge, the gas actions are performed. Thus, for lower pulse energies output at a same repetition rate, the gas actions will have longer temporal intervals corresponding proportionately to the accumulated energy applied to the discharge. However, another factor of the total time may be inserted into the calculation due to gas aging that may occur based separately on the total time from the last gas full. It is for example known that the gas mixture will degrade even when the laser is not operating, albeit at a much slower rate than when the discharges are occurring in the laser chamber 2.

A preferred algorithm also-factors in a cross factor that depends on both the accumulated energy applied to the discharge and the time. A further preferred algorithm takes into account the high voltage, and also may take into account cross factors involving the high voltage and one or both of time and accumulated energy applied to the discharge. Other parameters may also be taken into account in the algorithm, and so the algorithm is in no way to be construed as limited to taking into account only one or another or a combination of any of the above-mentioned parameters.

The input energy $E_1$ into the laser discharge depends on the charging voltage $U_1$. The capacity of a main storage capacitor of the power supply 3 pulser module 4 is C. The input energy for a single laser pulse is typically in the range of 2 to 10 J for a lithography laser system. So, we can express the input energy according to the well-known capacitor energy formula, as follows:

$$E = \frac{1}{2} * C * U^2$$

A gas replenishment action is preferably triggered when the accumulated input energy of a large number of laser pulses has reached a predetermined level. In a counter, the input energy of the laser pulses is added until a predetermined level $E_{repl}$ is achieved. This level is preferably in the range of 0.1 to 10 MJ for lithography laser systems.

$$E_{repl} = \Sigma E_i = \frac{1}{2} * C * \Sigma U_i^2,$$

where is the standard symbol for taking a summation, and $E_i$ and $U_i$ and the energies and voltages corresponding to the $i^{th}$ particular pulse.

Exemplary Simplified Calculation Method

The algorithm can be simplified if the expected variation in charging voltage is small, as is preferred. This makes calculation of the activation level $E_{repl}$ simpler.

$$U_i = U + \Delta U_i$$

$$U_i^2 = (U + \Delta U_i)^2 U^2 + 2 * U * \Delta U_i,$$

where the $\Delta U_i^2$ has been dropped according to this approximation. Then, $$E_{repl} \frac{1}{2} * C * \Sigma (U^2 + 2 * U * \Delta U_i)$$

This means the trigger level for gas replenishment $E_{repl}$ is proportional to the accumulated variation in charging voltage.

$$E_{repl} = [\frac{1}{2} * C * n * U^2] + [C * U * \Sigma U_i]$$

There may be many trigger levels such as $E_{repl}^1$, $E_{repl}^2$, etc. for performing different gas replenishment actions such as halogen injections or gas replacements of different amount or compositions of gases. As averred to above, the preferred gas replenishment algorithm may involve taking into consideration a combination of more just the accumulated energy applied to the discharge, such as including the time or charging voltage or other parameter that may be indicative of the halogen depletion in the laser tube 2.

Gas Control

Figure 3:
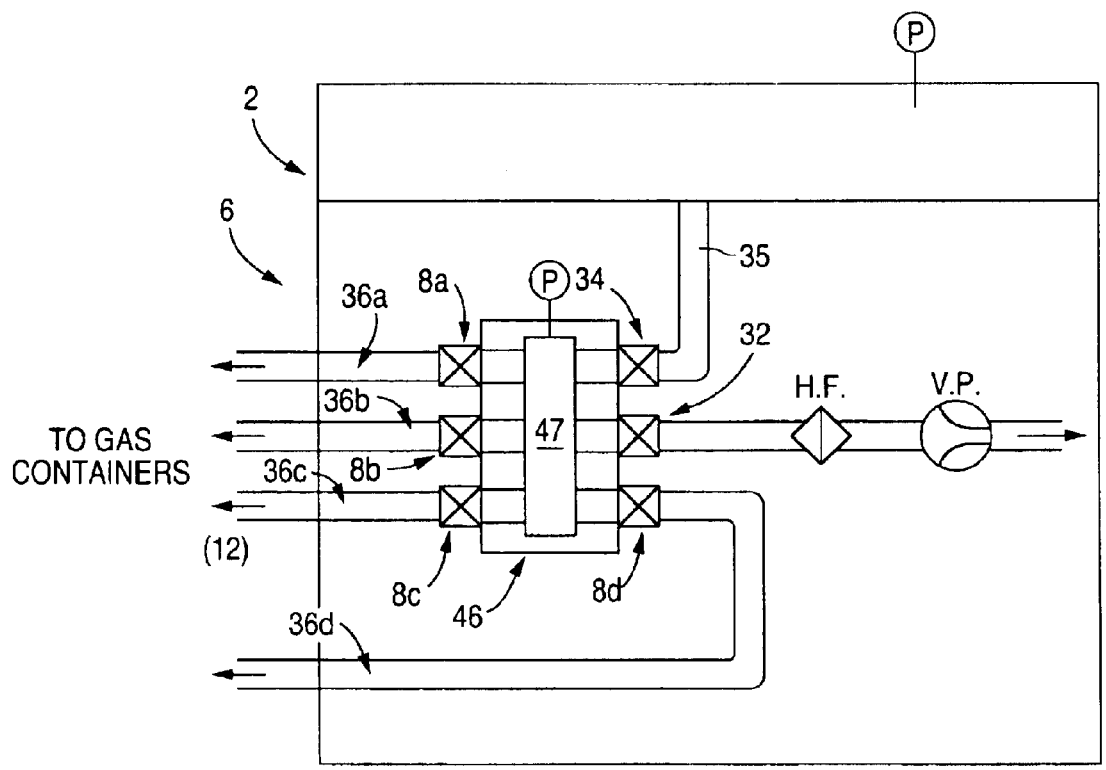
FIG. 3 schematically illustrates a gas control unit in accord with a preferred embodiment.

FIG. 3 schematically illustrates the gas handling module or gas control box 6 of FIG. 2 coupled with the laser chamber 2 according to a preferred embodiment. The gas control box 6 is connected to the laser tube 2 for supplying gas based on control signals received from the processor 16 shown in FIG. 2. The processor 16 regulates the delivery of gases or mixtures of gases to the laser tube 2 via a valve assembly 46 or system of valves. The valve assembly 46 preferably has a reservoir or compartment 47 having a known volume and having a pressure gauge P attached for measuring the pressure in the compartment 47. The compartment 47 as well as the laser tube 2 preferably also each have means, such as a thermocouple arrangement, for measuring the temperature of the gases within the compartment and tube. The compartment 47 may be 20 cm$^3$, e.g., in volumetric size (by contrast, the laser tube 2 may be, e.g., 40,000 cm$^3$ volumetrically). Four valves 8a–8d are shown in FIG. 3 as controlling the flow of gases contained in external gas containers into the compartment 47. Of course, more or less than four such valves may be provided. Another valve 32 is shown controlling the access of a vacuum pump vp to the compartment 47 which is shown connected through a halogen filter hf. Another valve 34 is shown controlling the flow of gases between the compartment 47 and the laser tube 2. A further valve or valves (not shown) may be provided along the line 35 from valve 34 to the tube 2 for controlling the atmosphere in the line 35, e.g., using a pump for evacuating the line 35.

Small amounts of a gas or gas mixture are preferably injected from the compartment 47 into the discharge chamber 2 as HIs or enhanced HIs, or during a PGR or MGR action. As an example, the gas supply connected to the valve assembly 46 through gas line 36a may be a premix A including, e.g., 1% $F_2$:99% Ne, and that through gas line 36b may be a premix B including 1% Kr:99% Ne, for a KrF laser. For an ArF laser, premix B would have Ar instead of Kr, and for a $F_2$ laser premix B is just Ne or He. The $F_2$ laser may have a combination of inert gases such as Ne and He in its premix A and/or in the gas mixture in the tube 2, as could the ArF laser, or either laser could have solely He as a buffer gas (see, e.g., the Ser. No. 09/317,526 application and the U.S. Pat. No. 4,393,505). Thus, by injecting premix A and premix B into the tube 2 via the valve assembly, the fluorine and krypton concentrations in the laser tube 2, respectively, for the KrF laser, e.g., may be replenished. Gas lines 36c and 36d may be used for different additional gas mixtures, such as one including a gas additive such as Xe as mentioned above (see the Ser. No. 09/513,025 application). Although not shown, the tube 2, may have additional means for releasing gas, or preferably, the gas is released through the valve assembly, such as via valves 34 and 32.

New fills, partial and mini gas replacements and gas injection procedures, e.g., enhanced and ordinary micro-halogen injections, and any and all other gas replenishment actions are initiated and controlled by the processor 16 which controls the valve assembly 46 and the pump vp based on various input information in a feedback loop.

An exemplary method according to the present invention is next described for accurately and precisely replenishing the fluorine concentration in the laser tube 2 in small amounts such that significant output beam parameters are not significantly disturbed, if at all, with each gas injection, in accord with the preferred embodiment and the approximation used in the above calculation for determining intervals of gas replenishment actions based on accumulated energy input to the discharge. The processor 16, which is monitoring a parameter indicative of the fluorine concentration in the laser tube 2, determines that it is time for a micro-halogen injection (HI), e.g., the amount $E_{repl}$ of accumulated energy to the discharge has been reached. It is understood that a replenishment action is desired now due to a known correlation between the depletion of the halogen and/or the active rare gas, or a build up of contaminant species in the tube 2.

The processor 16 then sends a signal that causes valve 8a to open and allow premix A to fill the compartment 47 to a predetermined pressure, e.g., 5 bar. Then, valve 8a is closed and valve 34 is opened allowing at least some of the premix A that was filled into the compartment 47 to release into the laser tube 2.

If the pressure in the tube was, e.g., 3 bar prior to the injection and the tube has 40,000 cm$^3$, and the injection is such that the pressure in the accumulator was reduced to 3 bar after the injection, then 2×20/40,000 bar would be the approximate pressure increase in the tube 2 as a result of the injection, or 1 mbar. If the premix A contains 1%$F_2$:99%Ne, then the increase in partial pressure of the $F_2$ in the laser tube as a result of the injection would be approximately 0.01 mbar.

The above calculation may be performed by the processor 16 to determine more precisely how much $F_2$ premix was injected, or prior to injection, the pressure in the compartment 47 may be set according to a calculation by the processor 16 concerning how much $F_2$ should be injected based on the status information of the monitored parameter, e.g., accumulated energy input to the discharge, time, etc., received by the processor 16, or based on pre-programmed criteria. A correction for difference in temperature between the gas in the compartment 47 and that in the tube 2 may also be performed by the processor 16 for more accuracy, or the temperature of the gas in the compartment 47 may be preset, e.g., to the temperature within the laser tube 2.

Preferably, an amount of gas premix corresponding to smaller than 10 mbar total gas pressure, or 0.1 mbar $F_2$ partial pressure, increase in the tube 2 is injected from the compartment 47. Even more preferably, less than 5 mbar or even 2 mbar total gas pressure, or less, (0.05 or 0.02 mbar $F_2$ partial pressure) increase in the laser tube 2 results from the gas injection.

The compartment 47 may simply be the valve assembly 46 itself, or may be an additional accumulator (described in detail below). The compartment 47 is also configured so that the small amounts of gas may be injected at successive very short intervals, to compensate a degradation of a halogen gas and/or another gas or gases within the discharge chamber 2 of an excimer or molecular laser such as a KrF, ArF or $F_2$ laser.

There may be more than one compartment like compartment 47, as described above, each having different properties such as volumetric space. For example, there may be two compartments, one for HIs and the other for enhanced HIs. There may be more than two, for still further versatility in the amounts of halogen to be injected in a gas action, and for adjusting the driving voltage ranges corresponding to different gas action algorithms. Different premixes may be injected from the different compartments. Also, the exemplary method has been described using premixes of particular gas compositions, but many different gas compositions could be used in accord with the present invention. For example, gas compositions having higher fluorine (or hydrogen chloride) percentage concentrations could be used such as 5% or 2% instead of 1%. There also may be an additional valve connected to a 100% buffer gas container, e.g., of Ne and/or He.

Advantageously, the processor 16 and gas supply unit 6 are configured to permit the delivery or injection of very small amounts of one or more gases or gas mixtures to the discharge chamber 2. The injection of the small amounts of the gas or gas mixture result in gas pressure increases in the discharge chamber 2 below 10 mbar, and preferably between 0.1 and 2 mbar. Each gas in the gas mixture within the discharge chamber 2 may be separately regulated so the gas composition within the discharge chamber 2 may be precisely controlled. For example, similar injections of Kr, Ar or Xe may be performed for replenishing those gases in the laser tube 2.

Because the amount of gas injected during a gas injection or replacement procedure is advantageously small, laser output beam parameters do not vary greatly with each injection. The injections are preferably carried out periodically at predetermined intervals corresponding to known depletion amounts of the gases. For example, if the halogen partial pressure in the gas mixture of a $F_2$ laser is known, under current operating conditions, to be around 3 bar after a new fill and to deplete by 0.01 mbar per X minutes or Y shots or Z Joules of accumulated energy input into the discharge then halogen injections including, e.g., 1 mbar (pressure increase in tube 2) of a premix including 1% $F_2$ could be performed every X minutes or Y shots or Z Joules, in accord with the present invention, to maintain the concentration of the halogen, or halogen injections of 2 mbar of the premix may be performed every X minutes, and so on. Also, micro-halogen injections (HI) of 1 mbar of premix A including 1% F2 and 99% Ne buffer may be injected every X/5 minutes for 100 minutes followed by a period of 100 minutes when no injections are performed, or every Z Joules for 100 times Z Joules followed by a period of 100 times Z Joules when no injection are performed, and so on. Many variations are possible within the spirit of the present invention including irregular gas actions as determined by the processor 16.

In contrast with the present invention, if, e.g., a 50 mbar (pressure increase in tube 2) premix A injection (again having 1% F2 such that the $F_2$ partial pressure increase in the tube 2 is 0.5 mbar and corresponds to around a 17% increase in the $F_2$ concentration in the tube 2) is performed every 50X minutes or 50Y shots or 5 times Z Joules, or at any time, the large injection amount will cause output beam parameters of the laser beam to noticeably and undesirably fluctuate in response. For example, the pulse energy or driving voltage can fluctuate by 10% or more when a large injection is performed. If the laser is not shut down, or industrial processing interrupted, when the large injection is performed, then imprecise industrial processing will occur due to disturbances in meaningful output beam parameters.

The halogen injection algorithm of the present invention may be considered to extend a total halogen injection over a longer period of time, or number of pulse counts or amount, or accumulated energy input into the discharge, or charging voltage or variations thereof, etc. Over the period of the several halogen injections, the high voltage and the $F_2$ concentration do not change significantly so that significant changes in pulse energy and pulse energy, moving average energy and energy dose stability, among other meaningful output beam parameters, are eliminated. Again, some of these other output beam parameters are listed above and each will be extremely stable using the method of the present invention.

Figure 4:
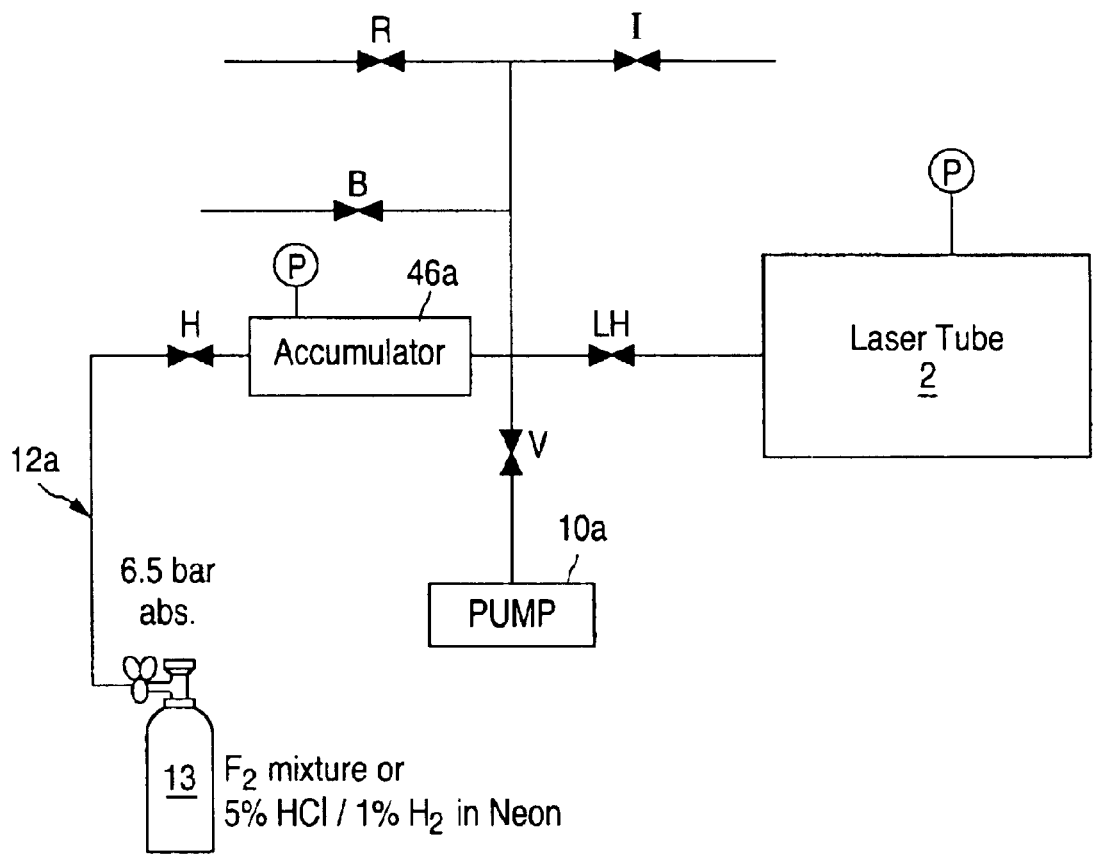
FIG. 4 schematically illustrates gas lines for halogen injections into the discharge chamber of the laser of FIG. 2 using an accumulator.

FIG. 4 schematically shows another configuration of gas lines for halogen injections into the discharge chamber 2 of the laser of FIG. 2 using an accumulator 46a. The accumulator 46a is connected to the laser tube 2 via laser head valve LH. The accumulator 46a is also connected to a gas line 12a via halogen valve H connected to a gas bottle 13 including the halogen or halogen premix. For example, the gas bottle 13 may be filled with a gas mixture including a $F_2$ mixture (e.g., 5% F2/95% Ne or a 5% HCl/1% H2 in neon mixture or a 1% F2:99% Ne premix, among other possibilities). A pump is shown connected to each of the accumulator 46a and the laser tube 2 via a vacuum valve V. The tube 2 is shown valve-connected to additional gas lines and valves including a buffer gas via valve B, a rare gas or rare gas premix via valve R (used with KrF, ArF, XeCl and XeF excimer lasers, e.g.) and an inert gas via valve I. The inert gas valve I or another valve not depicted may be used for valve connecting to a source of Xe to be used as an additive in the gas mixture within the tube. One or more additional accumulators may be added to the system.

The accumulator 46a has the particular advantage that the small amounts of gas including the $F_2$ within the $F_2$ premix to be injected with each halogen injection in accord with the present invention may be precisely controlled. The accumulator 46a is easily pumped to low pressure. A precise amount of $F_2$ gas or $F_2$ gas premix is released into the accumulator 46a and the amount of $F_2$ is determined according to the total gas pressure within the accumulator 46a, the known volumes of the accumulator 46a and the laser tube 2 and the known concentration of the $F_2$ or the $F_2$ percentage concentration in the premix gas. A $F_2$ partial pressure increase in the laser tube 2 after the injection is determined based on the amount of $F_2$ known to be in the accumulator 46a prior to (and possible after) the injection.

Based on this determination and/or other factors such as the interval between the previous and current gas actions (measured in time or pulse count or accumulated energy to the discharge or charging voltage or variation in charging voltage, e.g.) and/or the value of the driving voltage at the time of the previous, present and/or next gas action, the interval between the current and next gas action and/or the amount of halogen containing gas or total gas to be injected in the next gas action may be determined so that a precise amount of each gas, particularly the halogen-containing gas, may be injected in the next gas action. Also, the type of gas action to be performed may be determined based on these or other factors.

Various gas actions and procedures will now be described. The procedures are potentially applicable to all gas discharge lasers, although excimer lasers (e.g., KrF, ArF, XeCl and XeF) and the $F_2$ laser would benefit greatly by the present invention. The KrF-laser is used as a particular example below.

The process begins with a new fill which is performed prior to operating the laser system. For a new fill, the laser tube 2 is evacuated and a fresh gas mixture is then filled in. A new fill of a KrF-laser would typically result in a gas mixture having approximately the following partition of gases: F2:Kr:Ne=0.1%:1.0%:98.9%. If the gas mixture within the KrF laser discharge chamber 2 has a typical total pressure of around p=3000 mbar, then the partial pressures of $F_2$ and Kr would typically be around 3 mbar and 30 mbar, respectively. A new fill for a $F_2$ laser would produce the following typical partition of gases: F2:Ne and/or He=0.1% :99.9%. As suggested, for the $F_2$ laser, He or a mixture of He and Ne may be used as the buffer instead of only Ne (see the '526 application, above).

The new fill procedure can be performed using separate gas lines delivering pure or premixed gases. Typical gas premixes used regularly in semiconductor industry fabs are premixes A and B, where: premix A has 1% $F_2$/1% Kr in Ne and premix B has 1% Kr in Ne.

After the new fill is performed, the halogen gas begins to react with components of the laser tube 2 that it comes into contact with, whether the laser is operating or not. "Gas replenishment" is a general term which includes gas replacement (PGRs and MGRs each subject to varying amounts and compositions of injected and released gases) and gas injections (HIs and enhanced HIs again each subject to varying amounts and compositions of injected gases), performed to bring the gas mixture status back closer to new fill status.

Any gas replenishment procedures are performed taking into account that each gas in the gas mixture depletes at a different depletion rate due to the halogen depletion just described and the gas replenishment procedures performed in response. For the narrow band KrF-laser, e.g., $F_2$-depletion occurs at a rate of between about 0.1% to 0.3% (and sometimes up to nearly 1%) per million shots, whereas Kr reduction mostly due to losses incurred during PGRs occurs about 10 to 50 times more slowly. The Ne buffer is less important in this regard, but may also be considered as part of an overall gas replenishment operation, e.g., to maintain a desired pressure in the tube 2.

Separate gas actions are preferably performed to replenish each constituent gas of the gas mixture. For the KrF-laser, for example, the $F_2$ may be replenished by halogen or halogen/rare gas or premix A injections and the Kr replenished by rare gas or premix B injections. Other gas additives such as Xe may be replenished by Xe gas or still further premixes C, D, etc. The individual depletion rates also depend on operating conditions of the laser such as whether the laser is in broadband or narrow band mode, the operating energy level, whether the laser is turned off or is in continuous, standby or other burst pattern operation, and the operating repetition rate. The processor 16 is programmed to consider all of these variations in laser operation.

The gas mixture status is considered sufficiently stable in the present invention when deviations in fluorine and krypton content are below 5%, and preferably below 3%. Without any gas replenishment actions, after 100 million shots the partial pressures of $F_2$ might degrade by between 30% and 100% and between 0.5% 5%, respectively.

To compensate for the various depletion rates of the gases in the discharge chamber, the laser system of the preferred embodiment performs a variety of separate and cross-linked gas replenishment procedures, which take into account the variety of individual degradation rates by referring to a comprehensive database of different laser operating conditions. A preferred technique is disclosed in the Ser. No. 09/379,034 application already mentioned above. The behavior of the particular laser in operation and related experiences with gas degradation under different operating conditions are stored in that database and are used by a processor-controlled "expert system" to determine the current conditions in the laser and manage the gas replenishment or refurbishment operations. A history of gas actions performed during the current operation of the laser may also be used in accord with the present invention.

As mentioned above, series of small gas injections (referred to as enhanced and ordinary micro gas or halogen injections, or HI) can be used to return any constituent gas of an excimer or molecular laser, particularly the very active halogen, to its optimal concentration in the discharge chamber without disturbing significant output beam parameters. However, the gas mixture also degrades over time as contaminants build up in the discharge chamber 2. Therefore, mini gas replacements (mGR) and partial gas replacements (PGR) are also performed in the preferred methods. Gas replacement generally involves releasing some gas from the discharge chamber, including expelling some of the contaminants. mGR involves replacement of a small amount of gas periodically at longer intervals than the small HIs are performed. PGR involves still larger gas replacement and is performed at still longer periodic intervals generally for "cleaning" the gas mixture. The precise intervals in each case depend on consulting current laser operating conditions and the expert system and comprehensive database. The intervals are changes of parameters which vary with a known relationship to the degradation of the gas mixture. As such, the intervals may be one or a combination of time, pulse count, accumulated energy input to the discharge, charging or driving voltage or variations in charging voltage, pulse shape, pulse duration, pulse stability, beam profile, coherence, discharge width or bandwidth. In addition, the accumulated pulse energy dose may used as such an interval. Each of HI, mGR and may be performed while the laser system is up and running, thus not compromising laser uptime.

Three exemplary gas replenishment methods for stabilizing an optimum gas mixture are described below. Many other methods are possible including combinations of the ones described below. The methods and parameters used may also be varied during the laser operation depending on the laser operating conditions and based on the data base and the expert system. The processor 2 and gas supply unit 6 are configured to perform many methods based on a comprehensive database of laser operating conditions and gas mixtures statuses.

Each method involves well-defined very small gas actions with small, successive gas injections preferably by injecting a premix of less than 10 mbar and more preferably between 0.1 and 2 mbar including a concentration including preferably 5% or less of the halogen containing species in order not to disturb the laser operation and output beam parameters. Whatever the composition of the premix, it is the amount of the halogen in the premix that is most significant. That is, the preferred amount of the halogen containing species that is injected in the small gas actions preferably corresponds to less than 0.1 or 0.2 mbar and more preferably between 0.001 and 0.02 mbar partial pressure increase in the laser tube 2.

Gas Replenishment Based at Least in Part on Time

The first parameter mentioned above for performing gas replenishment based on was accumulated energy applied to the discharge of the laser. A second exemplary gas stabilization method involves performing gas injections based at least in part on operation time. Preferably, the method used takes into account both of these parameters. This method takes into account whether or not the laser is operating, i.e., whether the laser system is up and performing industrial processing, in standby mode, or simply shut off. The method is thus useful for maintaining either an active or a passive gas composition status. Note that the descriptions below of various gas replenishment procedures based on time can be used with gas replenishment procedures based on accumulated energy applied to the discharge. Thus, a separate discussion is omitted wherein time is replaced with accumulated energy applied to the discharge, and in general, these parameters, and other such as charging voltage and variations in charging voltage, may be interchangeable in the discussion that follows and combinable in gas replenishment algorithms within the scope of the invention.

Time-correlated HI, mGR and PGR are performed according to a selectable time interval based on operating conditions. For example, HIs may be performed after time intervals t1, mGRs after time intervals t2, and PGRs after time intervals t3.

In accord with the preferred embodiment, the time intervals t1, t2 and t3 are adjusted in real time as are the amounts and/or compositions of gases injected during the gas actions. Preferably, the time intervals and gas amounts and compositions are adjusted from gas action to gas action. In addition, the driving voltage ranges within which particular gas actions are performed are preferably also adjusted, at least at each new fill based on the aging of the tube and optical components of the laser resonator. Such ranges may be adjusted during operation, even between new fills, e.g., based on beam-induced effects on the optical components of the line-narrowing module (see for a general explanation of such effects U.S. patent application Ser. No. 09/454,803, assigned to the same assignee and hereby incorporated by reference).

Below, detailed graphs are described for an operating laser system in accord with a preferred embodiment. Typically, gas actions occur after several hours if the laser is in the standby-mode without pulsing or pulsing with low repetition rate (<100 Hz). If the laser is completely switched off (power-off-mode), a battery driven internal clock is still running and the expert system can release an adequate, time controlled number of injections during the warm-up phase after re-starting the laser. The number and amount of the injections can be also related to certain driving voltage start conditions which initiate a preferred sequence of gas actions to reestablish optimum gas quality.

Figure 5:
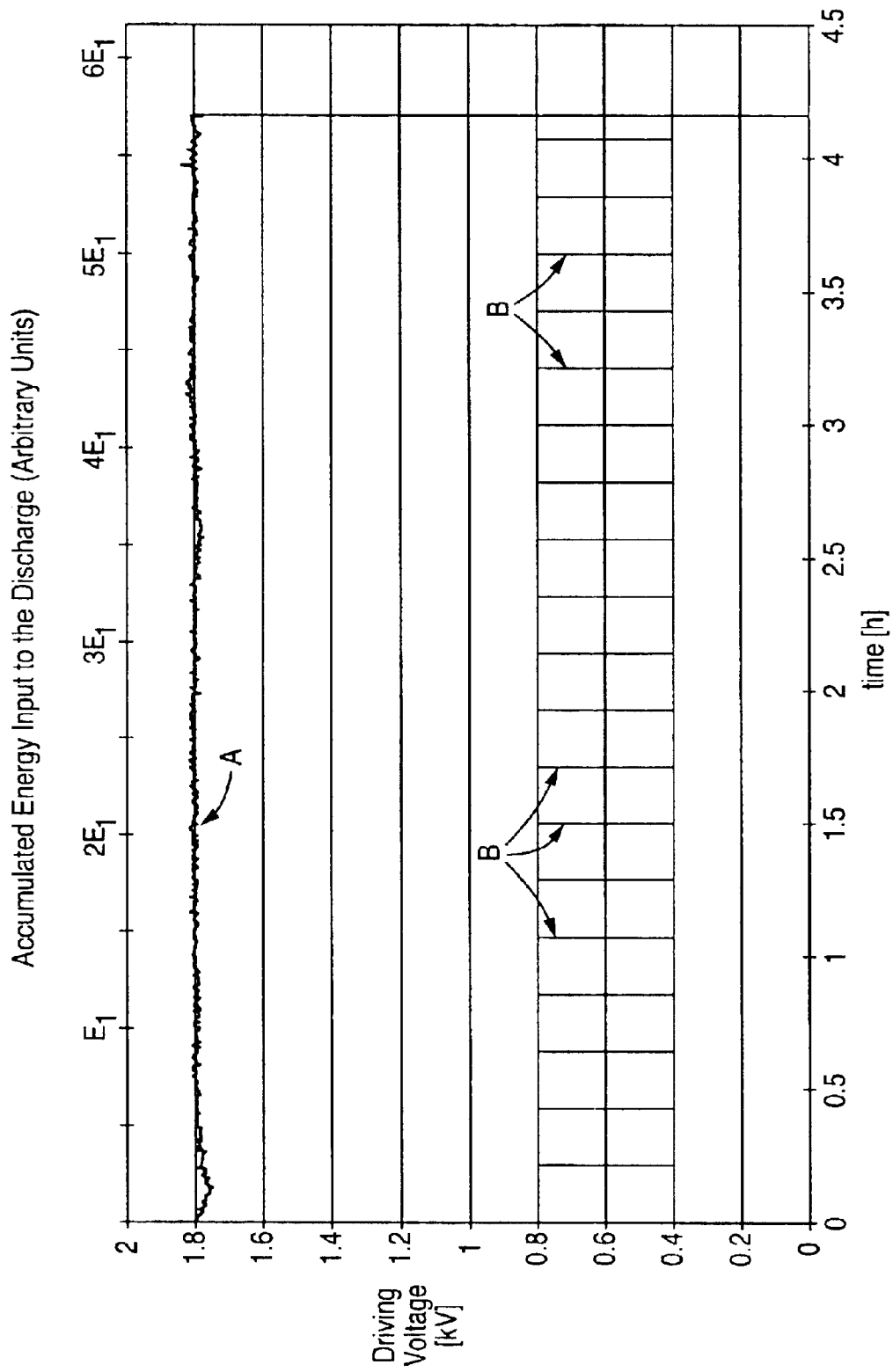
FIG. 5 is a graph of charging voltage versus time and accumulated energy applied to the discharge also showing periodic halogen injections for a laser system in accord with the preferred embodiment.
Figure 6:
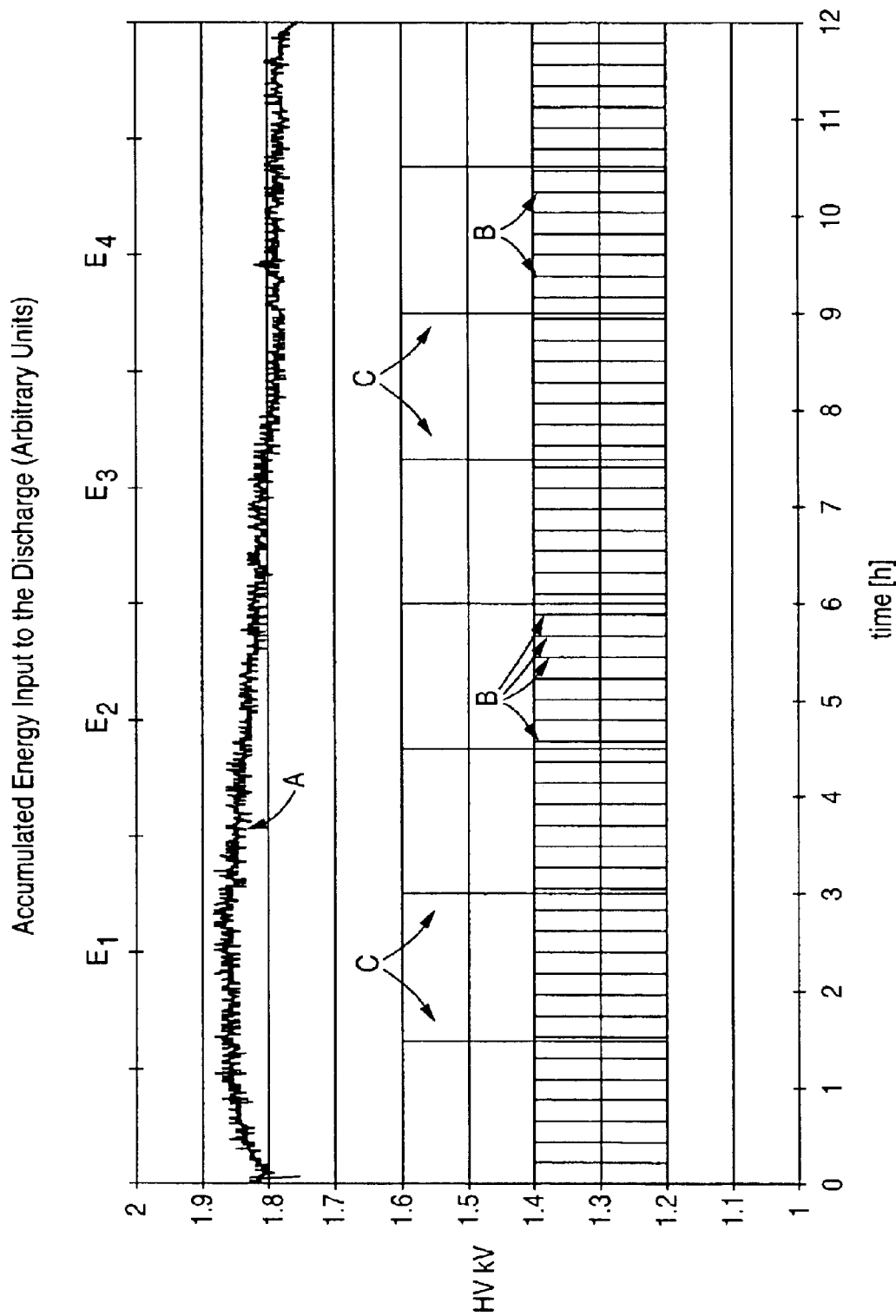
FIG. 6 is a graph of charging voltage versus time also showing periodic halogen injections for a laser system in accord with the preferred embodiment.

FIGS. 5 and 6 are graphs of driving voltage versus time also illustrating the intervals of periodic HI and periodic HI and mGR, respectively, for a fully operating system in accord with the present invention. FIG. 5 includes a plot of driving voltage versus time (A) wherein HIs are performed about every 12 minutes, as indicated by the vertical lines (some of which are designated for reference with a "B") on the graph, for a narrowband laser running in 2000 Hz burst mode at 10 mJ output beam energy. The vertical axis only corresponds to graph A. As is shown by graph A, the small HIs produce no noticeable discontinuities in the driving voltage. The top horizontal axis shows the increasing accumulated energy to the discharge.

FIG. 6 is a plot (labelled "A") of driving voltage versus time wherein HIs are performed about every 12 minutes, as indicated by the short vertical lines on the graph (again, some of which are designated for reference with a "B" and the vertical axis doesn't describe the halogen injections in any way), and mGR is performed about every 90 minutes, as indicated by the taller vertical lines on the graph (some of which are designated with a "C" for reference and again the vertical axis is insignificant in regard to the mGRs shown), for a narrowband laser running in 2000 Hz burst mode at 10 mJ output beam energy. Again, the driving voltage is substantially constant around 1.8 KV and no major changes, e.g., more than 5%, are observed. As with FIG. 5, the top horizontal axis shows the increasing accumulated energy to the discharge.

Figure 7:
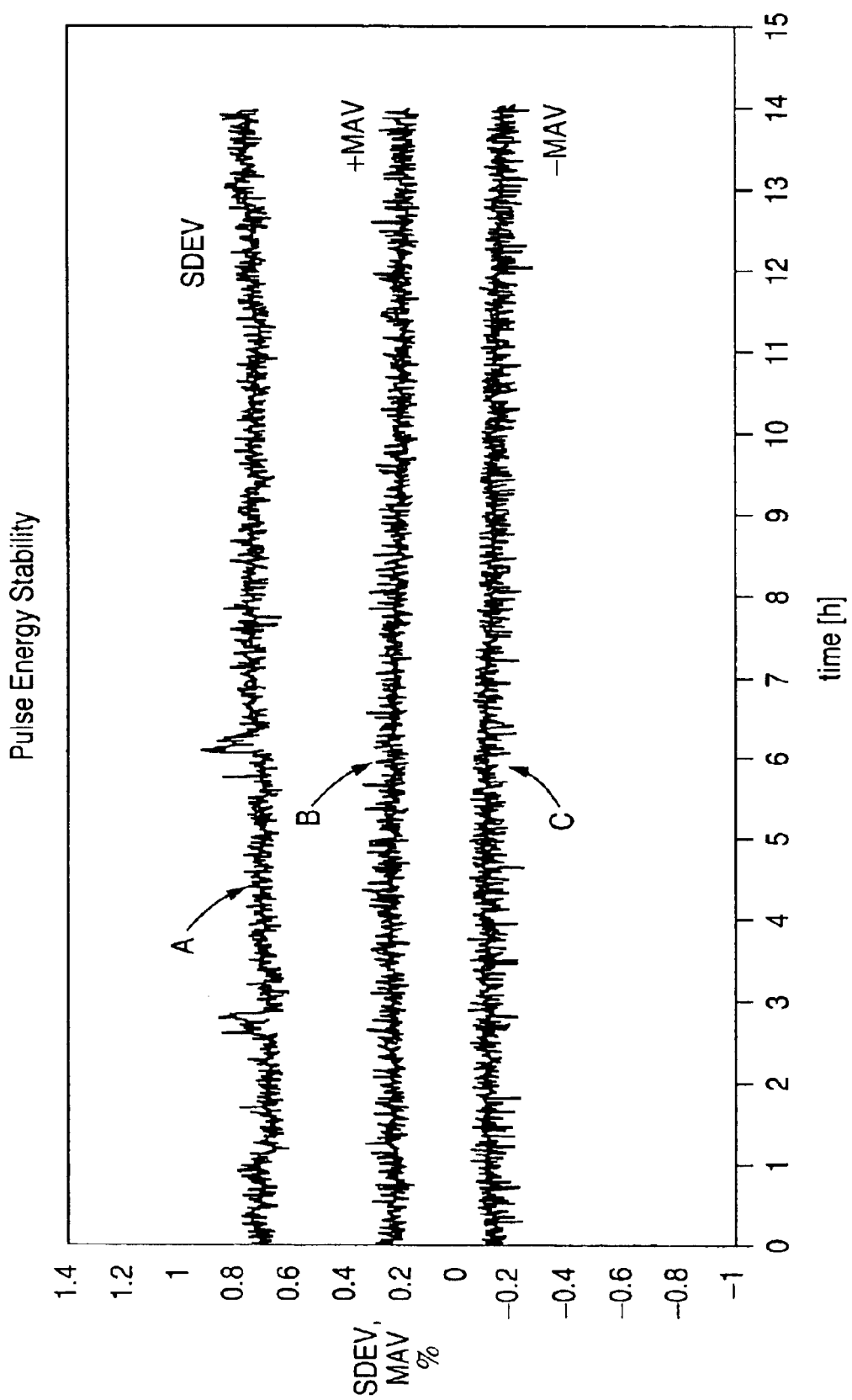
FIG. 7 is a graph of pulse energy stability (sigma, upper graph) versus time and moving averages (over 40 pulse intervals, maximum and minimum) for a laser system operating a 2 KHz in accord with the preferred embodiment.

FIG. 7 includes a graph (labelled "A") of pulse energy stability versus time of the laser pulses by values of standard deviation (SDEV) and moving average stabilities (±MAV) as percentages of the absolute pulse energy for a system in accord with the present invention. The graphs labelled "B" and "C" show the moving average for groups of 40 pulses each. During this run, micro-halogen injections were performed resulting in very stable continuous laser operation without any detectable deviations caused by the gas replenishment actions.

Gas Replenishment Based at Least in Part on Accumulated Energy Applied to the Discharge (and/or Pulse Count)

A second exemplary gas stabilization method involves performing gas injections based on accumulated energy applied to the discharge using an accumulated energy counter, and alternatively, on shot or pulse count using a shot or pulse counter. After certain amount of accumulated energies, or numbers of laser pulses, e.g., N($\mu$HI), N(mGR), and N(PGR), depending again on the mode of operation of the laser, $\mu$HI, mGR and PGR can be respectively performed. Typically, the $\mu$HIs amount to about 0.5 . . . 2.0 mbar of fluorine premix (e.g., 1–5% $F_2$:95–99% Ne) for the KrF, ArF, XeF or $F_2$ lasers (Ne being replaceable with He or a mix of He and Ne) or HCl premix (e.g., 1–5% HCl:1% $H_2$ in Ne or He) for XeCl or KrCl laser and are released after several hundred thousand or even after millions of laser shots. Each $\mu$HI just compensates the halogen depletion since the last gas action and typically corresponds to less than 0.1 mbar of the halogen containing species and more preferably between 0.001 and a 0.02 mbar partial pressure increase in the laser tube 2 per, e.g., 1 million shots. The actual amounts and shot intervals vary depending on the type of laser, the composition of the discharge chamber, the original gas mixture composition and operating mode, e.g., energy, or repetition rate, being used.

As averred to above, an additional method that is not specifically set forth that is in accord with the preferred embodiment and includes many of the details set forth above, and uses accumulated energy applied to the discharge or a combination thereof with time, charging voltage and/or variations in charging voltage. The total input electrical energy to the discharge is maintained in a counter for that purpose, and gas actions are performed after certain intervals or amounts of this input electrical energy are applied.

Also, in accord with the preferred embodiment, the intervals of any of the exemplary methods are dynamically adjusted from injection to injection, as are the amounts of halogen injected with each gas action. The interval between the current and next injection is set based on any one or a combination of parameters such as the driving voltage or any of the output beam parameters described above. In addition, the amount of halogen injected in the current injection and/or the interval between the previous and current injection may be taken into account.

The amount of halogen injected in any HI or enhanced HI may be determined in accord with the present invention by measuring the pressure in the accumulator 46, 46a (see FIGS. 4–5) and the laser tube 2 at the time of the injection, and/or just before, and/or just after the injection. The temperatures of the gases in the accumulator 46,46a and tube 2 may be measured as well. The interior volumes of the tube 2 and accumulator 46,46a are known in advance. The well-known formula PV=NkBT is used to calculate the amount of halogen injected into the tube during any injection.

For example, if the accumulator 46,46a has a measured halogen partial pressure Pa, and temperature Ta, and a volume Va, then the accumulator 46,46a contains Na fluorine molecules. If all of the Na molecules are injected into the laser tube during the injection, and the tube has a temperature TT and volume VT, then the change in fluorine partial pressure in the tube as a result of the injection will be $P(F_2)T=PaVaTT/VTTa$. Since it is desired to maintain the total number of fluorine molecules in the tube, then it may be more appropriate to calculate the change in the number of fluorine molecules in the tube, i.e., $N(F_2)T=P(F2)TVT/kBTT$, and keep track of that quantity. Then, the amount of halogen and/or the interval before the next injection is determined based on the calculated amount of halogen that was injected in the previous injection, the partial pressure of the halogen in the tube after the previous injection and/or the amount of halogen that it is desired to have in the tube after the next injection.

The overall calculation depends also on the amount of depletion that the halogen gas has undergone (or will undergo) between injections. Such depletion is, in principal, known as a function of many factors, e.g., including time and accumulated energy to the discharge (and possibly any of the parameters enumerated above or others). For example, a change in halogen partial pressure (or, alternatively, the number of halogen molecules) in the laser tube 2 in the interval between injections can be calculated to depend on $kt \times t$ and on $kp \times E_{input}$, wherein kt and $kE_{input}$ are constants that depend on the rate of halogen depletion with time and accumulated energy input to the discharge, respectively, and t and $E_{input}$ are the amount of time and the accumulated energy input to the discharge, respectively, in the interval under consideration. The amount of accumulated energy to the discharge itself depends on the repetition rate and pulse energy, taking into account also the number of pulses in a burst and the pause intervals between bursts for a laser operating in burst mode. Again, other parameters may have an effect and may be additive terms included with this calculation.

Now, from one interval to the next, a calculation could be performed as follows. The increase (or decrease reflected as a negative sum) in fluorine partial pressure in the laser tube over the interval is calculated to be:

$$\Delta P(F_2)_{intrval} \approx P(F_2)_{injection} - k_t \times \Delta t - k_{Ei} \times \Delta Ei,$$

where $\Delta E_i$ is the total energy applied to the discharge since the previous halogen injection and $\Delta t$ is the time since the last injection. Again, additional terms may relate to charging voltage, variations in charging voltage and/or pulse count and the $k_i$ terms for any of these parameters may depend on many factors such as repetition rate, pulse energy, laser output power, burst conditions, age of the laser, the gas mixture and/or the optics or electrodes of the laser, etc.

Since it is the total number of fluorine molecules that it is desired to keep constant, then a calculation of the change in the number of molecules is calculated as:

$$\Delta N(F_2)_{interval} \approx N(F_2)_{injection} - k_t \times \Delta t - k_{Ei} \times \Delta E_i,$$

where the constants $k_t$ and $k_{Ei}$ would differ from the partial pressure calculation by a units conversion.

The overall algorithm would seek to maintain the total number of halogen molecules (or halogen partial pressure) constant. Thus, the changes in particle number (or partial pressure) would be summed continuously over many intervals, or preferably all intervals since the last new fill. That overall sum would be maintained as close as possible to zero, in accord with the present invention.

As discussed, the accumulated energy into the discharge counter can also be used in combination with time related gas replenishment, and either of the accumulated energy counter or time related gas replenishment can be used in combination with the pulse count, charging voltage and/or variation in the charging voltage, among many other parameters such as ASE, Temporal pulse shape, etc., as mentioned above. The accumulated energy counter or total applied energy can be used for different laser pulse operation modes, e.g., burst patterns, or continuous pulsing modes at different pulse repetitions wherein a number of individual time or shot or input energy, etc., counters $N_i(\mu HI)$ are used. All of these different counters can be stored in the database of the expert system. Which of the different counters $N_i(HI)$ is to be used at any time is determined by the software of the expert system.

Figure 8:
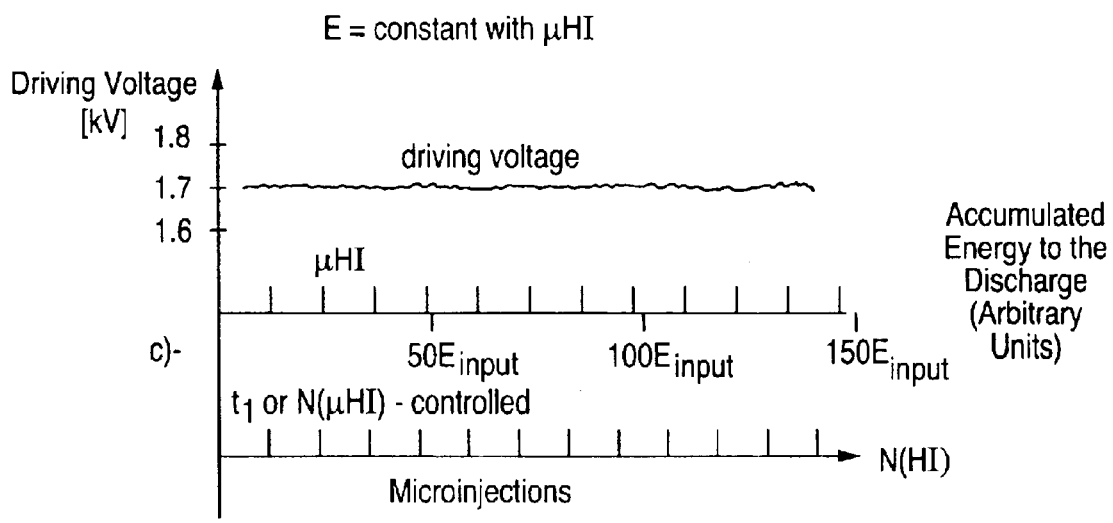
FIG. 8 is a qualitative graph of driving voltage versus time also showing periodic micro-halogen injections (HI) for a system in accord with a preferred embodiment.

FIG. 8 illustrates qualitatively a driving voltage free of discontinuities when small partial pressure increases are effected in the laser discharge chamber due to HIs in accord with the present invention. The driving voltage is shown as being substantially constant at around 1.7 KV over 150 $E_i$, wherein $E_i$ is an amount of input energy into the discharge, e.g., in Joules, which may correspond with respect to gas replenishment for particular operating laser conditions to, e.g., 150 million pulses, while HIs are performed about once every 12 $E_i$, which may correspond to, e.g., 12 million pulses. The pulse energy is also maintained at a constant level.

The expert system can use a different kind of counter, e.g., $N_i(mGR)$ and/or $N_i(PGR)$ for other types of gas actions for any of the parameters being counted (i.e., different from the $N_i(\mu HI)$). Gas replacement actions such as mGR and PGR replace or substitute different gases of the gas mixture in the laser tube by predetermined amounts. As mentioned, mGR and PGR include a gas injection accompanied by a release of gases from the laser tube, whereas $\mu$HIs do not involve a release of gases. Gas releases can be performed simply to reduce the pressure in the laser tube, as well as for expelling contaminants from the gas mixture. Unequal degradations of the individual gas components within the gas mixture are nicely compensated using mGR and PGR, and again, different numbers $N_i(mGR)$ and $N_i(PGR)$ may be used for different operating modes and conditions as determined by the expert system. All of these settings, i.e., $N_i(\mu HI)$, $N_i(mGR)$, $N_i(PGR)$ and the separately selectable portions of injections for each gas can be adapted for the aging of the laser tube, and/or the aging of the resonator optics, taking into account changing conditions of gas consumption and replenishments as the laser system components age. The amount of compensation can be pre-selected by manual settings or based on settings in the data base of the computer controlled expert system. For mGR, like; $\mu$HI, the portions of injected gases amount to a few mbar total pressure increase in the laser tube (or percent only). The mGR is combined with a small pressure release of some few to 10 mbar of the pressure of the tube, preferably bringing the pressure in the tube back near to the pressure in the tube just after the last new fill.

More than one gas may be injected or replaced in the same gas action. For example, a certain amount of halogen and a certain amount of an active rare gas and/or a gas additive for an excimer or molecular fluorine laser may be injected together into the laser tube. This injection may be accompanied by a small pressure release as with mGR or PGR. Alternatively, this mixture of the halogen and rare or additive gases may simply be injected to increase the partial pressure of each gas within the discharge chamber without any accompanying release of gases.

Gas Replenishment Based at Least in Part on Charging Voltage or Variations in Charging Voltage A third exemplary gas stabilization method involves performing gas injections based on operating driving voltage values of the laser. This method may especially be combined with any of the first, second and third exemplary methods. That is, the time related $t_1(\mu HI)$, $t_2(mGR)$, $t_3(PGR)$ and the input electrical energy to the discharge counter-related $N_i(\mu HI)$, $N_i(mGR)$, $N_i(PGR)$ gas actions, discussed above, are generally adjusted during operation depending on the value of the operating driving or charging voltage, and preferably, on the operation band of the driving voltage.

Figure 9:
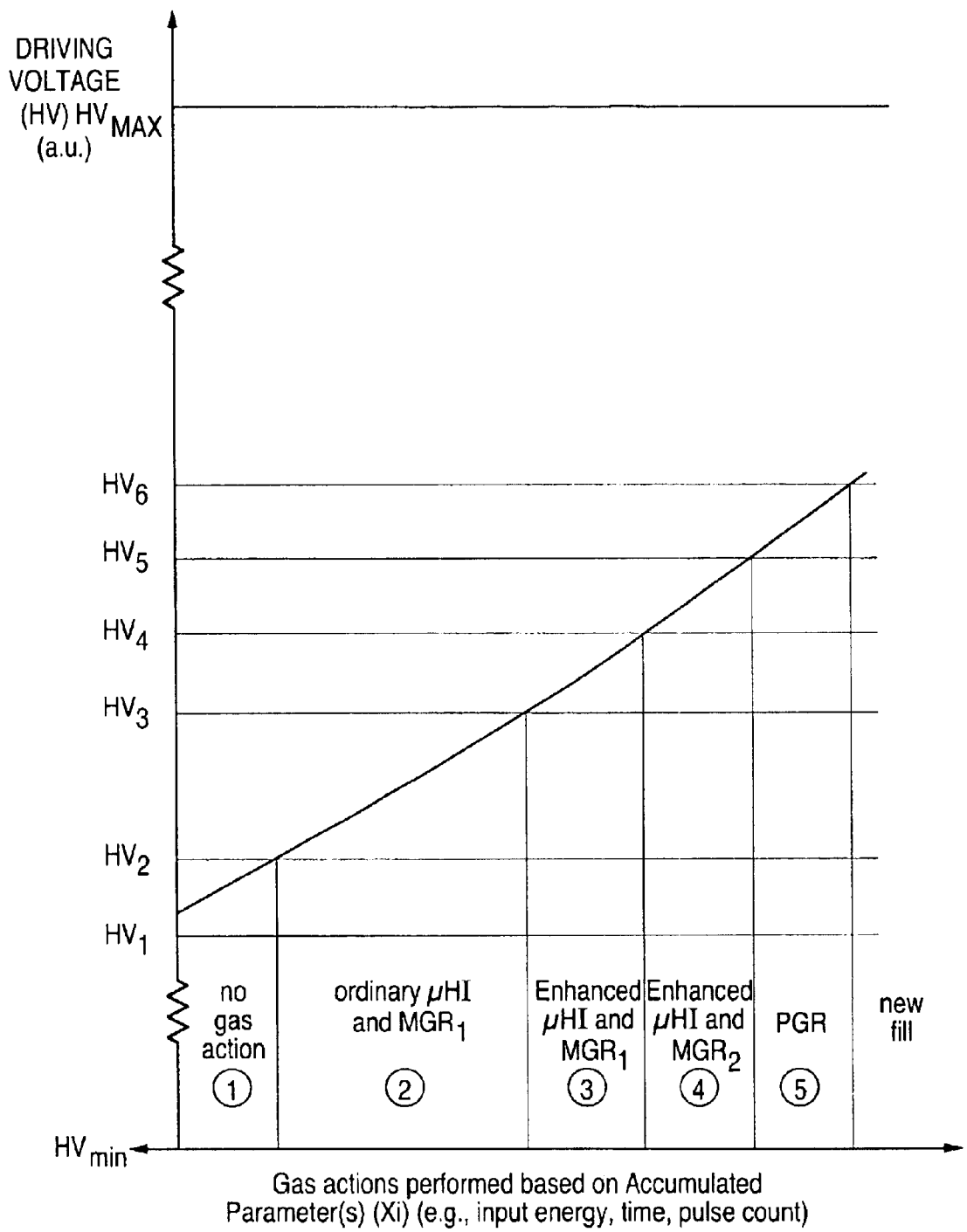
FIG. 9 is a qualitative graph of driving voltage versus pulse count also showing periodic halogen injections, mini-gas replacements and partial gas replacements for a system in accord with a preferred embodiment.

Referring to FIG. 9, several driving voltage levels ($HV_i$) can be defined wherein particular gas actions are predetermined to be performed. The processor 16 monitors the driving voltage and causes the gas supply unit to perform gas injections of varying degrees and partial and mini gas replacements of varying degrees depending on the value of the driving voltage, or which preset range the current operating driving voltage is in (y-axis of FIG. 9), based on such parameters as time, pulse count and/or total input electrical energy to the discharge, etc. see above) (x-axis of FIG. 9).

An example in accord with the present invention is next described with reference to FIG. 9. The laser system may operate at driving voltages between $HV_{min}$ and $HV_{max}$. The actual operating minimum and maximum driving voltages are set to be in a much smaller range between $HV_1$ and $HV_6$, as illustrated by the broken ordinate axis. An advantage of this embodiment is that the range $HV_1$ to $HV_6$ itself may be reduced to a very small window such that the operating voltage is never varied greatly during operation of the laser. Where this operating range itself lies between $HV_{min}$ and $HV_{max}$, i.e., the actual voltage range (in Volts) corresponding to the range may be adjusted, e.g., to increase the lifetimes of the optical components of the resonator and the laser tube, e.g., such as by adjusting an output energy attenuating gas additive (see the '025 application, mentioned above).

The coordinate axis of FIG. 9 denotes the gas actions that are performed, based on one or more accumulated parameters, when the driving voltage is in each interval. The general order of performance of the gas actions is from left to right as the gas mixture ages. However, when each gas action is performed, the driving voltage is checked, and the next gas action may correspond to the same driving voltage range, or a different one denoted to the left or the right of that range. For example, after a PGR is performed (when it is determined that the driving voltage is above $HV_5$), the driving voltage may be reduced to between $HV_2$ and $HV_3$, and so the system would return to ordinary HI and mGR, gas control operations.

Within the operating range between $HV_1$ and $HV_6$, several other ranges are defined. For example, when the driving voltage HV is between $HV_1$ and $HV_2$ (i.e., $HV_1<HV<HV_2$), no gas actions are performed as there is a sufficient amount of halogen in the gas mixture. When the driving voltage is between $HV_2$ and $HV_3$ (i.e., $HV_2<HV<HV_3$), mGR, and ordinary HI are performed periodically based on the accumulated parameter(s) (i.e., input electrical energy to the discharge, time, and/or pulse count, etc.). This is the ordinary range of operation of the system in accord with the preferred embodiment.

When the driving voltage is between $HV_3$ and $HV_4$ (i.e., $HV_3>HV>HV_4$), one or both of the injection amounts of the HIs and the mGRs with corresponding gas releases is increased. In this example, the only HIs are increased. Thus, the range between $HV_3$ and $HV_4$ in FIG. 9 is the range within which enhanced HIs are performed, and the same mGR amounts as in the previous range between $HV_2$ and $HV_3$ are maintained. Enhanced HIs may differ from ordinary HIs in one or both of two ways. First, the amount per injection may be increased. Second, the interval between successive HIs may be increased.

The range between $HV_4$ and $HV_5$ (i.e., $HV_4<HV<HV5_5$) represents a new range within which one or both of the injection amounts of the HIs and the mGRs with corresponding gas releases is increased. In this example, only the mGRs are increased. Thus, an enhanced amount of halogen gas is injected (with corresponding release of gases) during each $mGR_2$ than the ordinary amount $MGR_1$ when the driving voltage is in the range between $HV_4$ and $HV_5$. The HIs are also performed periodically in this range to recondition the gas mixture. It is noted here that several ranges wherein either or both of the amounts injected during the HIs and mGRs is adjusted may be defined each corresponding to a defined driving voltage range. Also, as mentioned above with respect to monitoring the pressure (and optionally the temperature) in the accumulator (and optionally the laser tube), the amount injected may be adjusted for each injection.

When the driving voltage is above $HV_5$ (i.e., $HV_5<HV<HV_6$), a replace up to ten percent or more of the gas mixture. Certain safeguards may be used here to prevent unwanted gas actions from occurring when, for example, the laser is being tuned. One is to allow a certain time to pass (such as several minutes) after the $HV_5$ level is crossed before the gas action is allowed to be performed, thus ensuring that the driving voltage actually increased due to gas mixture degradation. When the driving voltage goes above $HV_6$, then it is time for a new fill of the laser tube. It is noted here that the magnitudes of the driving voltages ranges shown in FIG. 9 are not necessarily drawn to scale.

Figure 10:
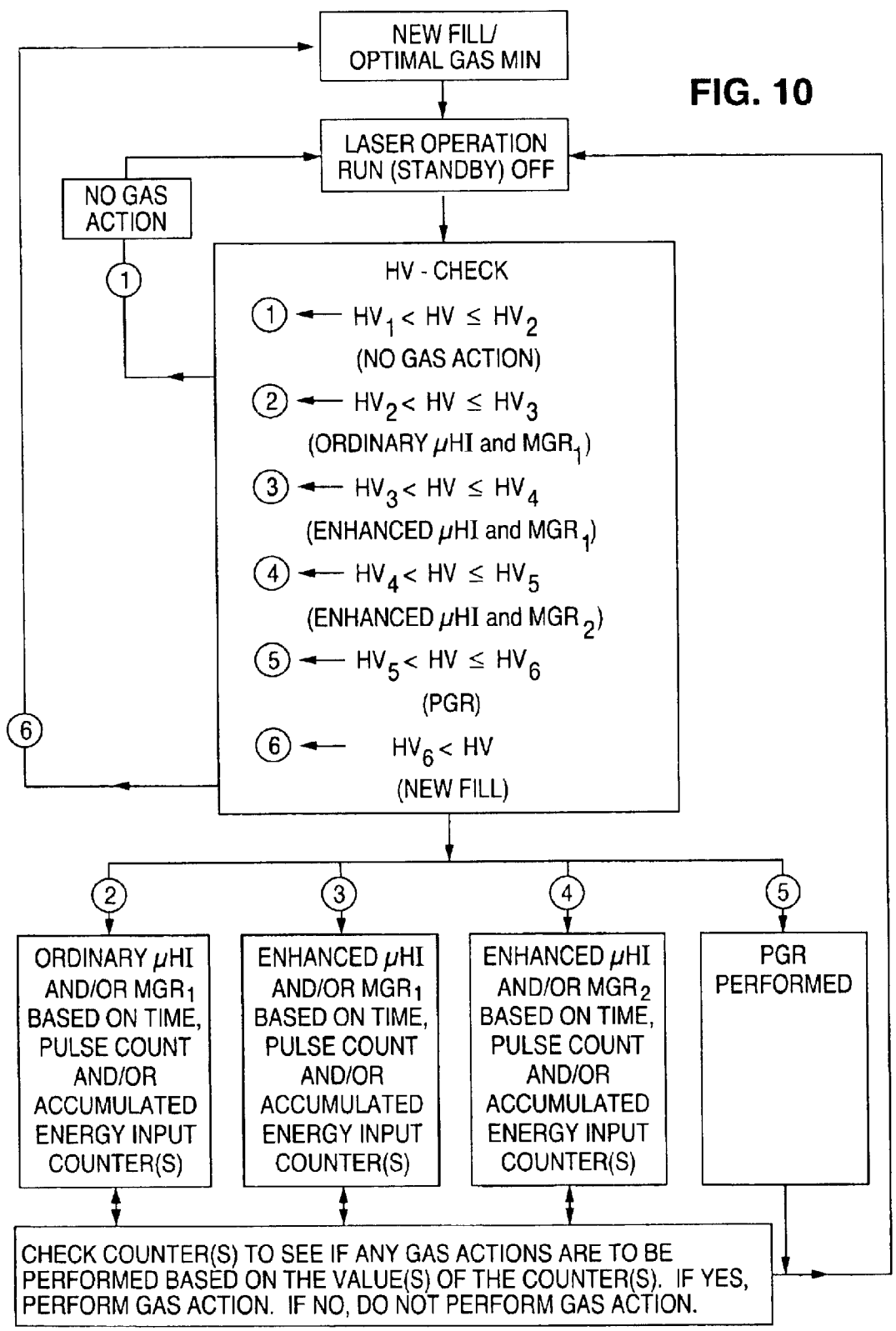
FIG. 10 is a flow diagram for performing halogen injections, mini gas replacements and partial gas replacements in accord with a preferred embodiment.

FIG. 10 is a flow diagram for performing ordinary and enhanced HIs, mGRs and PGRs in accord with a preferred embodiment and the example set forth as FIG. 9. The procedure starts with a new fill, wherein the discharge chamber 2 is filled with an optimal gas mixture. The laser can thereafter be operated for industrial applications under various conditions such as in different modes at various repetition rate and emitting at certain pulse energies or moving averages, be in stand-by mode or be shut off completely. A driving voltage check (HV-check) is next performed to determine which gas action would be a candidate for a next gas action. The gas action may be performed based solely on the driving voltage in one embodiment. In a preferred embodiment, a next step is first performed.

The measured driving voltage (HV) is compared with predetermined values for $HV_1$ through $HV_6$. The processor determines whether HV lies between $HV_1$ and $HV_2$ (i.e., $HV_1<HV<HV_2$) and thus path (1) is followed and no gas actions are to be performed and the procedure returns to the previous step. Although not shown, if the HV lies below $HV_1$, then a procedure may be followed to decrease the halogen concentration in the laser tube, such as by releasing some laser gas and injecting some buffer gas into the laser tube.

If the processor determines that the HV lies between $HV_2$ and $HV_3$, then the system is within the ordinary operating driving voltage band. If it is within the ordinary operating band, then path (2) is followed whereby ordinary HIs and $mGR_1$ may be performed based preferably on time, input electrical energy to the discharge and/or pulse count intervals as predetermined by the expert system based on operating conditions. Whether a $\mu$HIs or $mGR_1$ is performed will preferably depend on the reading or readings of one or more counters of time, accumulated energy applied to the discharge, pulse count, ASE, temporal pulse shape, charging voltage variation, etc. Again each gas action may be adjusted depending on the calculated partial pressure or number of halogen molecules in the laser tube, as described above.

The HIs and $mGR_1$ performed when path (2) is followed may be determined in accordance with any method set forth in U.S. patent application Ser. No. 09/379,034, already incorporated by reference. If HV afterward not within the ordinary operating band, then it is determined whether HV lies below $HV_2$ (i.e., $HV<HV_2$). If HV is below $HV_2$, then path (1) is followed and no gas actions are performed.

If HV lies between $HV_3$ and $HV_4$ (i.e., $HV_3<HV<HV_4$), then path (3) is followed and enhanced HI and mGR1 may be performed again based on and depending on the counter value or values of the time, pulse count and/or applied electrical energy to the discharge counters or other counters being used. The precise amounts and compositions of gases that are injected and those that are released are preferably determined by the expert system and will depend on operating conditions.

If HV lies between $HV_4$ and $HV_5$ (i.e., $HV_4<HV<HV_5$), then path (4) is followed and enhanced HI and $mGR_2$ may be performed depending again a determination based on checking the values of the counters. Again, the precise amounts and compositions of gases that are injected and those that are released are preferably determined by the expert system and will depend on operating conditions.

If HV lies between $HV_5$ and $HV_6$ (i.e., $HV_5<HV<HV_6$), then PGR is performed. If HV lies above $HV_6$ (i.e., $HV_6<HV$), then a new fill is performed.

After any of paths (2)–(5) is followed and a corresponding gas actions is performed, and preferably after a specific settling time, the method returns to the step of determining the operating mode of the laser and measuring and comparing HV again with the predetermined HV levels $HV_1$ through $HV_6$.

The setting of all of these different driving voltage levels and time, applied electrical energy to the discharge, driving voltage variation, ASE, temporal pulse shape and/or pulse count schedules, among the others mentioned above, can be done individually or can refer to a computer controlled database where they may be stored for different operation conditions. The operation of the laser at different HV-levels under different operation conditions such as continuous pulsing or burst mode may be taken into consideration.

The combination of all of these different kinds of gas control and replenishment mechanisms involves harmonizing many factors and variables. Combined with the expert system and database, the processor controlled laser system of the present invention offers an extended gas lifetime before a new fill is necessary. In principle, bringing down the laser system for new fill might be totally prevented. The lifetime of the laser system would then depend on scheduled maintenance intervals determined by other laser components such as those for laser tube window or other optical components exchange.

The above described gas replenishment procedures may be combined with cryogenic or electrostatic gas purification techniques. For this purpose, U.S. Pat. Nos. 4,534,034, 5,001,721, 5,111,473, 5,136,605 and 5,430,752 are hereby incorporated by reference into the present application. Standard methods typically include using a cold trap to freeze out contaminants before recycling the gas back into the discharge chamber. Some of the contaminants being frozen out are molecular combinations of active gases such as the active rare and halogen gases of excimer lasers. Thus, a significant amount of these important laser gases is removed from gas mixture in the discharge chamber. The result is a rapid decrease in rare and halogen gas concentrations undesirably affecting output beam parameters.

In summary, the preferred embodiment provides a method and procedure for stabilizing an original or optimal gas composition of a gas discharge laser, and particularly an excimer or molecular fluorine ($F_2$) laser. During a long period of operation of the laser in a running or stand-by mode, the depletion of the laser gas is continuously monitored by monitoring and controlling the high voltage, laser pulse shape, ASE, elapsed time after new fill or other additional laser parameters some of which have been set forth above, in addition to accumulated electrical energy applied to the discharge, time and/or pulse count. According to a database of known histories and trends of key operating parameters for various lasers operating under various conditions, a processor-controlled procedure is applied to replenish the gas degradation. The stabilization process involves using a number of tiny gas actions (micro injections) performed preferably based on specified time, driving voltage change, input electrical energy to the discharge and/or shot count intervals, a combination thereof or some other interval relating to a parameter which changes with a known relationship to the gas mixture degradation. A careful combination of μHIs and mGRs of various amounts, and PGRs, are used to effect very nearly complete stabilization of the laser gas mixture over a potentially unlimited duration.

Perhaps most importantly, the gas actions described herein do not disturb meaningful output beam parameters or operation of the laser, because they are smooth and controlled based on an expert system comprising myriad operating conditions of the laser system. Thus, the laser can operate without interruption during the gas replenishment actions and industrial processing can be performed with high efficiency. Further details of the preferred gas replenishment actions that are triggered in accord with this first aspect of the invention are set forth in the Ser. No. 09/447,882 and No. 60/171,717 applications, and elsewhere in the patent documents mentioned above, e.g., U.S. Pat. No. 4,997,573.

Burst Control Algorithms

Figure 1:
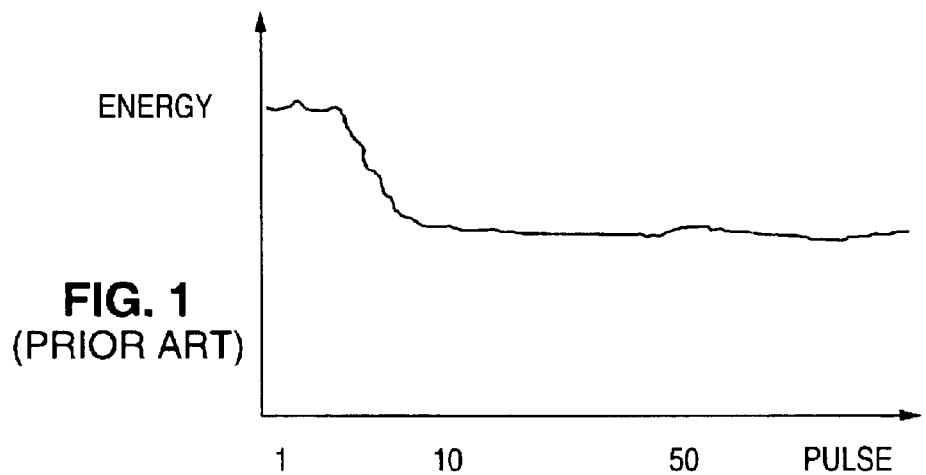
FIG. 1 illustrates energy versus pulse number for a burst of pulses from a pulsed gas discharge laser having the input high voltage kept constant during the burst.

A preferred embodiment with respect to the second aspect of the invention is now described below, wherein a laser control computer or processor 16 is preferably programmed with a self-learning algorithm for reducing the charging voltage for initial pulses of a burst following each long burst pause. In this way, the tendency for energy spiking or overshoot after a long burst pause, such as is illustrated at FIG. 1, is advantageously compensated by reducing the high voltage for initial pulses in the burst. In addition, by a fast energy regulation loop, a substantially constant energy dose over an entire die site or wafer location is achieved. The output energy of pulses or groups of pulses in bursts is compared with a target energy or energy dose or moving average energy to minimize variations in the moving energy average or energy dose fluctuations over entire bursts following both short and long burst breaks, i.e., to improve the moving average energy stability or energy dose stability of the laser system.

In particular, preferably two energy control methods are used in accord with this preferred embodiment. A first algorithm, or overshoot algorithm, controls 1 to 10 pulses at the beginning of a burst, and a second algorithm, or control algorithm, controls the other pulses in the burst.

Description of the Overshoot Algorithm table contains the high voltage values for a number of initial pulses in a burst. In this example, the high voltage values for up to 10 pulses is kept in the tables, as shown and as follows:

Table 1 is used for the beginning of the first burst after a long burst break,

Table 2 is used for the beginning of the second burst after a long burst break,

Table 3 is used for all other bursts.

On startup of the laser, the values in the tables are all set to preferably a middle HV. Then, the values that have been stored on the last laser operation cycle are preferably loaded, if available. On shutdown of the laser, the actual values are stored to disk.

Generally, there are two typical burst break periods: (1) long burst breaks and (2) short burst breaks:

short burst breaks have a very short relative duration, e.g., around 20 to 50 ms; and long burst breaks are typically much longer than the minimum time, e.g., 20 times the duration of a short burst break.

The length of a short burst break in ms can be set by software (typical value 50 ms, but is configurable to any selected amount). The length of a long burst break is typically set to 20 times the length of a short burst break. Thus, some exemplary burst break definitions might include, for example:

0 to 50 ms corresponding to no break;

50 ms to 20×50 ms=1 s corresponding to a short break; and 1 s or more corresponding to a long burst break.

The energy controller preferably has a timer that counts milliseconds. This counter is reset after each light pulse. If the counter reaches the number that is set as the length of a short burst break, a short burst break is recognized. If the counter reaches the number that is set as the minimum length of a long burst break times this number, a long burst break is recognized.

During a long burst break, the power supply charges to the HV value that is provided in the first position, i.e., HV1, of Table 1 to prepare for the first pulse. When the first pulse is triggered, and the HV1 value from Table 1 is applied and causes the first pulse to occur, the resulting pulse energy is

TABLE 1

| for the first burst after a long burst break | | | | | | | | | |
|---|---|---|---|---|---|---|---|---|---|
| HV1 | HV2 | HV3 | HV4 | HV5 | HV6 | HV7 | HV8 | HV9 | HV10 |

TABLE 2

| for the second burst after a long burst break | | | | | | | | | |
|---|---|---|---|---|---|---|---|---|---|
| HV1 | HV2 | HV3 | HV4 | HV5 | HV6 | HV7 | HV8 | HV9 | HV10 |

TABLE 3

| for all other bursts | | | | | | | | | |
|---|---|---|---|---|---|---|---|---|---|
| HV1 | HV2 | HV3 | HV4 | HV5 | HV6 | HV7 | HV8 | HV9 | HV10 |

The energy controller contains preferably three tables as shown above. Alternatively, two or more than three tables may be used within the scope of this embodiment. Each measured. If the energy is too low or too high, i.e., the measured pulse energy is different from a target energy, then the HV value for the first pulse in Table 1 is increased or decreased depending on the degree of variance with the target energy, and possibly some other factors such as results of previous measurements of first pulses after previous long burst breaks. That is, the power supply is charged to HV1 and the measured energy of the resulting first pulse is $E1_M$. Then, the measured energy $E1_M$ is subtracted from the target energy $E1_T$ to get $\pm E1 = E1_T - E1_M$. Then, $\pm HV1 = HV1_{new} - HV1$ is used, wherein $\pm HV1$ is calculated from $\pm E1$, and $\pm HV1$ is added to or subtracted from HV1, such as to replace HV1 with $HV1_{new}$ in the first position of Table 1. As a result, the first pulse of the first burst of the next burst sequence following a long burst break will be closer to the target energy, and the controller preferably continues to learn the optimal HV settings by successive iterations.

This process preferably continues to be performed for several first pulses HV1 following subsequent long burst breaks, and the same procedure of measuring the energy, comparing with the target energy and updating Table 1 is performed. The, the power supply charges to the high voltage HV2 given in the second place of Table 1 to prepare for the second pulse in the first burst following a long burst break, and so on, in a similar manner as just described with respect to the first pulse after a long burst break. That is, the same procedure is preferably performed for each of the initial pulses, e.g., the first ten pulses as shown, and the values HV1 through HV10 are calculated and updated. After a fixed number of pulses, the number being configurable between 1 and more than the ten pulses exemplified in the tables, the control mode changes to the second control algorithm (see below) for the remaining pulses of the first burst.

After the next short burst break (this means for the second burst in the burst sequence following the long burst break), a similar algorithm is applied, except Table 2 is used. Again, the number of pulses in the second burst that the first algorithm is performed on is configurable, and can be more or less than ten, and can be more or less than the number of pulses used in Table 1 for the first burst. After preferably every following short burst break (this means for all other bursts in the burst sequence) Table 3 is used. Again, the number of pulses in the third burst that the first algorithm is performed on is configurable, and can be ten or more or less than ten, and can be the same or more or less than the number used in either Table 1 or Table 2. Table 3 is preferably used as this last table in the first control algorithm, but Table 2 or a fourth or later table may be used for this function of being applied to all subsequent bursts following a long burst break and before a next long burst break.

After the next long burst break, everything is repeated, starting with Table 1. This way the energy controller learns the optimal HV settings for the first pulses of every burst. Note that after a long burst break, however, the algorithm switches back to Table 1 notwithstanding which table was used after the previous break.

Preferably, a initial learning phase for the first 10 or so burst sequences is used, while a slower learning phase is used for subsequent burst sequences. The fast learning phase is started when the energy set-point is changed or when the energy control mode is changed. The slow learning phase is preferably always active. Thus, the amount of HV correction is preferably determined as follows:

For the first 10 or other number of burst sequences the HV is corrected proportionally to the energy deviation, so that a fast learning takes place.

For later burst sequences, the HV is corrected only by one or two or more least significant digits, e.g., two digits, or is corrected by adding or subtracting a small HV from the existing value in the table. That is, after the learning performed in the first few burst sequences, there will not likely be a need to make large corrections to the HV values in the table.

Preferably, the HV for pulse numbers n=10 or less in burst number m following a long burst break does not significantly depend on the energy of the immediately preceding pulses but only on the pulses with the same number in prior burst sequences. Alternatively, both the energies of preceding pulses and the pulses with the same number in prior burst sequences can be figured into the calculation and determination of the HV for that pulse number in a subsequent burst number m.

The HV values in the tables are determined such that the resulting pulse energies will be substantially constant, e.g., at around 10 mJ for each initial pulse. The target energy of the laser may be varied, though, such as between, e.g., 9.5 mJ and 10.5 mJ. Therefore, the HV value is also changed to meet the actual target energy. This is preferably done by gradient. That is, the HV value may be determined that will produce a pulse having an energy of 9.5 mJ and the HV value may be determined that will produce a pulse having an energy of 10.5 mJ. The resulting gradient, e.g. 100 V/mJ, is used to change the HV in the table. The learning algorithm does not need to be changed in this way when the target energy is maintained at 10 mJ, nor need it be changed when for burst occurring after the target energy has been changed and the adjustment made.

Description of Control Algorithm

After the HV values for initial pulses in a burst are taken from the tables and used to create the initial pulses according to the overshoot algorithm, the control algorithm is used to set the HV values for the remaining pulses in each burst. According to a first embodiment of the control algorithm, for each pulse the energy deviation from a target energy is determined. The deviation determined is preferably multiplied by an amplification factor ($k_g$). The result is added to the HV that was used for the preceding pulse, and this value is used for the next pulse. This stabilizes the output pulse energy stability.

Alternatively, for each group of X pulses, the deviation from a target moving average energy is determined. The deviation is used to determine a HV for a next pulse or to determine HV values for several subsequent pulses.

Also alternatively, for each die site, a number of pulses may be incident during a scanning process. The total energy delivered to that die site, and for each die site, or the energy dose, is determined and compared with a target energy dose. The deviation is used to determine a HV for a next pulse or to determine HV values for several subsequent pulses. The moving average and energy dose are thus related. The sum of n pulse energies, e.g., for 40 pulse energies, is the energy dose that is kept constant for each package of n subsequent pulses. This sum, divided by the number of pulses in it, is called moving average. It can be illustrated as a time window that is moved through the burst and always contains the same number of pulses (except at the beginning of the burst). The initial pulses subject to the overshoot algorithm may or may not be used in this determination.

Note that for stepper lithography systems, the wafer stage is not moved during exposure. Each pulse illuminates the full area of a chip. In this case, the total energy dose, i.e., the sum of all pulse energies applied to a chip, is utilized and the energy dose per die site is not. Scanners, on the other hand, move the wafer stage during exposure. Each pulse illuminates a rectangular area that moves over the chip from pulse to pulse. Illuminated rectangles of subsequent pulses overlap. Each point on the chip is illuminated by several pulses, typically about 40. The dose is preferably kept the same for each point or die site on the chip although the different points are illuminated by different actual laser pulses, or in other words, by pulses emitted at different times. Thus, the moving average is kept constant.

In this regard, maintaining energy dose stability may differ according to the preferred embodiment from maintaining pulse energy stability. For example, over the 40 pulses that impinge upon a die site, the standard deviation may vary more or less while the energy dose remains the same. To illustrate, at one point on the wafer, pulses of twenty each alternating 9.9 mJ and 10.1 mJ pulses may impinge upon the site, or pulses of twenty each alternating 9.95 mJ and 10.05 mJ pulses may impinge upon the site. In each case, a moving average of 10 mJ is observed, even though the pulse energy stability greater in the latter case that in the former. As long as the total energy dose applied at each point on the wafer is substantially the same, then the energy dose stability will be high, notwithstanding the pulse energy stability, as the above example shows.

The moving average window can be set by the parameter w. That is, the controller 16 computes the sum of energy deviations of several pulses, e.g., i pulses, multiplies the sum with a correction factor $k_i$ and divides by the parameter w, i.e., the HV value is corrected by the factor $E*k_i/w$. The sum of the energy deviations becomes more and more important with increasing number of pulses i because the parameter w is independent of the number of pulses i. The sum is set to 0 after each detected short or long burst break. The sum is preferably calculated as follows:

for $0<i<(w-1)$, s is the sum of the energy deviation of the first i pulses; and for $i \geqq (w-1)$: s is the sum of the energy deviation of the last (w-1) pulses For example, w may be set at 40, and the controller 16 may compute the sum of the deviations of the first 39 pulses in a burst and correct the HV for the $40^{th}$ pulse accordingly (i.e., by correction factor $k_i$) according to the first bullet above. The same goes for earlier pulses in the burst, i.e., such that the sum of the deviations of the first 15 pulses, e.g., in a burst is computed and the HV of the $16^{th}$ pulse is corrected accordingly. Then, for each pulse after the $40^{th}$ pulse, only the previous 39 pulses are used according to the second bullet above. Thus, the dose stability according to the control algorithm of the present invention is advantageously improved.

Note that in this preferred control algorithm, the HV values for pulses in a burst, and corrections and updates made thereto, only depend on the preceding pulses in the burst, and not on prior burst sequences. In addition, the overshoot control is enhanced at the same time in accord with the overshoot algorithm. Thus, the overshoot algorithm may be advantageously used for controlling the energies of initial pulses in a burst, while the control algorithm may be advantageously used for controlling the energies or moving average energies or energy doses corresponding to the pulses in the burst after the initial pulses. Thus, the control algorithm and the overshoot algorithm may be combined for advantageous energy, energy stability, energy dose stability and energy overshoot control.

A laser system may be set to work in a variety of modes. If the laser is set to work in energy burst mode, then the overshoot and control algorithms discussed above are preferably used. If the laser is set to energy constant mode, then the control algorithm is used as discussed above, and no overshoot is used because the laser is assumed not to use bursts so that no overshoot would occur wherein HV compensation would be used.

Some specific laser operating modes include:

External HV mode, wherein the internal energy controller 16 is not used, and the HV values are directly computed by an external controller.

NDC (New Due Control), wherein instead of using an internal laser energy sensor, an energy sensor in the scanner is used. The energy values may be sent to the energy controller 16 over a parallel interface, e.g., for each pulse. The rest of the controller algorithm may be left unchanged.

ECI mode (energy control interface), wherein a serial interface may be used to change controller parameters and the energy set-point. This system may be typically used only in burst pauses.

The regulation loop for constant moving energy average according to the preferred embodiments includes charging voltage regulation for each shot at the beginning of a burst. In a preferred laser system, the charging voltage variations made are small enough not to affect other laser output beam parameters significantly (see the Ser. No. 09/447,882 and No. 60/171,717 applications for further discussions on this point).

The average pulse energy or energy dose or moving average depends on the particular exposure process. For example, different resists may correspond to different energy doses used. The target energy is achieved by corresponding adjustment of the charging voltage. Typical charging voltages are in the range of 1.4 to 2.0 kV. Pulse energy adjustments may be achieved by voltage adjustment of preferably between about 10 to 400 V.

While exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow, and equivalents thereof.

In addition, in the method claims that follow, the steps have been ordered in selected typographical sequences. However, the sequences have been selected and so ordered for typographical convenience and are not intended to imply any particular order for performing the steps, except for those claims wherein a particular ordering of steps is expressly set forth or understood by one of ordinary skill in the art as being necessary.

What is claimed is:

1. An energy control software database embodied in a computer readable medium for controlling output energies of successive pulses in a burst of pulses from a gas discharge laser operating in burst mode and characterized by emitting bursts of several pulses each followed by one of a long burst break and a short burst break depending on specifications of an application process, comprising:

a first table of input voltage values to be read by a processor which signals a power supply circuit to apply voltages according to the voltage values in the first table to thereby generate initial pulses in a subsequent first burst of output laser pulses after a long burst break each having a substantially same energy value, said input voltage values in said first table having been calculated from measured data of initial pulses in at least one previous first burst after a long burst break and for producing said initial pulses each at said substantially same energy value;

a second table of input voltage values to be read by said processor which signals said power supply circuit to apply voltages according to the voltage values in the second table to thereby generate initial pulses in a subsequent second burst of output laser pulses following a short burst break after a first burst after a long burst break, said initial pulses in said subsequent second burst each having said substantially same energy value, said input voltage values in said second table having been calculated from measured data of initial pulses in at least one previous second burst following a short burst break after a first burst after a long burst break and for producing said initial pulses each at said substantially same energy value; and wherein input voltage values of the first table are modified pursuant to a fast learning phase during a first learning stage, wherein the fast learning phase provides for modifying input voltage values proportional to a detected difference between a desired output energy and a measured output energy; and wherein input voltage values of the first table are modified pursuant to a slow learning phase during a second learning stage, wherein the slow learning phase provides for modifying input voltage values by no more than maximum specified correction amount, in response to a detected difference between a desired output energy and a measured output energy.

2. The database of claim 1, further comprising a third table of input voltage values to be read by said processor which signals said power supply circuit to apply voltages according to the voltage values in the third table to thereby generate initial pulses in a subsequent third or later burst following a short burst break after first and second bursts after a long burst break, said initial pulses in said subsequent third or later burst each having said substantially same energy value, said input voltage values in said third table having been calculated from measured data of initial pulses in at least one previous third or later burst following a short burst break after a first and second bursts after a long burst break and for producing said initial pulses each at said substantially same energy value.

3. The database of claim 2, wherein said third table is further read by said processor for signaling said power supply circuit to apply voltages according to the voltage values in said third table to thereby generate initial pulses in several bursts just following short burst breaks in addition to said third or later burst, said initial pulses in each of said several bursts each having said substantially same energy value.

4. The database of claim 2, wherein said third table is further read by said processor for signaling said power supply circuit to apply voltages according to the voltage values in said third table to thereby generate initial pulses in all other bursts just following short burst breaks other than said second burst following said short burst break after said first burst after said long burst break, in addition to said third or later burst, said initial pulses in each of said all other bursts each having said substantially same energy value.

5. The database of claim 1, wherein said first table is created according to the steps of:
  measuring energies of initial pulses of a first burst following a long burst break;
  calculating values of input voltages for initial pulses based on the measured initial pulse energies that would bring output energies of the laser corresponding to each of said initial pulses to a substantially same predetermined value for a subsequent first burst following a similar long burst break; and
  storing the calculated values of input voltages for initial pulses as said first table, such that pulses generated according to input voltage values stored in the first table have a substantially same predetermined output energy value.

6. The database of claim 5, wherein the first table is updated according to the further steps of:
  measuring energies of initial pulses of a subsequent first burst following a subsequent long burst break;
  calculating values of input voltages for initial pulses based on the measured initial pulse energies of the subsequent first burst that would bring output energies of the laser corresponding to each of said initial pulses to a substantially same predetermined value for another subsequent first burst following another subsequent long burst break; and
  updating the values in the first table of input voltages for initial pulses in said first table using the calculated values of input voltages for initial pulses based on the measured initial pulses energies of the subsequent first burst, such that pulses generated according to input voltage values stored in the first table have a substantially same predetermined output energy value.

7. A database embodied in a computer readable medium for controlling output energies of successive pulses in a burst of pulses from a gas discharge laser operating in burst mode and characterized by emitting bursts of several pulses each followed by one of a long burst break and a short burst break depending on specifications of an application process, comprising:

a first table of input voltage values to be read by a processor which signals a power supply circuit to apply voltages according to the voltage values in the first table to thereby generate initial pulses in a subsequent first burst of output laser pulses after a long burst break each having a substantially same energy value;

a second table of input voltage values to be read by said processor which signals said power supply circuit to apply voltages according to the voltage values in the second table to thereby generate initial pulses in a subsequent second burst of output laser pulses following a short burst break after a first burst after a long burst break;

wherein input voltage values of the first table are modified pursuant to a fast learning phase during a first learning stage, wherein the fast learning phase provides for modifying input voltage values proportional to a detected difference between a desired output energy and a measured output energy; and wherein input voltage values of the first table are modified pursuant to a slow learning phase during a second learning stage, wherein the slow learning phase provides for modifying input voltage values by no more than maximum specified correction amount, in response to a detected difference between a desired output energy and a measured output energy.

8. The database of claim 7, further comprising a third table of input voltage values to be read by said processor which signals said power supply circuit to apply voltages according to the voltage values in the third table to thereby generate initial pulses in a subsequent third or later burst following a short burst break after first and second bursts after a long burst break, said initial pulses in said subsequent third or later burst each having said substantially same energy value.

9. The database of claim 8, wherein said third table is further read by said processor for signaling said power supply circuit to apply voltages according to the voltage values in said third table to thereby generate initial pulses in several bursts just following short burst breaks in addition to said third or later burst, said initial pulses in each of said several bursts each having said substantially same energy value.

10. The database of claim 8, wherein said third table is further read by said processor for signaling said power supply circuit to apply voltages according to the voltage values in said third table to thereby generate initial pulses in all other bursts just following short burst breaks other than said second burst following said short burst break after said first burst after said long burst break, in addition to said third or later burst, said initial pulses in each of said all other bursts each having said substantially same energy value.

11. The database of claim 7, wherein said first table is created according to the steps of:

measuring energies of initial pulses of a first burst following a long burst break;

calculating values of input voltages for initial pulses based on the measured initial pulse energies that would bring output energies of the laser corresponding to each of said initial pulses to a substantially same predetermined value for a subsequent first burst following a similar long burst break; and storing the calculated values of input voltages for initial pulses as said first table, such that pulses generated according to input voltage values stored in the first table have a substantially same predetermined output energy value.

12. The database of claim 11, wherein the first table is updated according to the further steps of:

measuring energies of initial pulses of a subsequent first burst following a subsequent long burst break;

calculating values of input voltages for initial pulses based on the measured initial pulse energies of the subsequent first burst that would bring output energies of the laser corresponding to each of said initial pulses to a substantially same predetermined value for another subsequent first burst following another subsequent long burst break; and updating the values in the first table of input voltages for initial pulses in said first table using the calculated values of input voltages for initial pulses based on the measured initial pulses energies of the subsequent first burst, such that pulses generated according to input voltage values stored in the first table have a substantially same predetermined output energy value.

* * * * *